US012651916B2

(12) United States Patent
Zhang et al.

(10) Patent No.: US 12,651,916 B2
(45) Date of Patent: Jun. 9, 2026

(54) ELECTRONIC DEVICE, CHARGING METHOD, AND CHARGING SYSTEM FOR CHARGING BATTERIES IN SERIES

(71) Applicant: HUAWEI TECHNOLOGIES CO., LTD., Shenzhen (CN)

(72) Inventors: Mingwei Zhang, Shenzhen (CN); Ruichao Tang, Shenzhen (CN); Lihou Ma, Shenzhen (CN); Hui Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 1091 days.

(21) Appl. No.: 17/695,474

(22) Filed: Mar. 15, 2022

(65) Prior Publication Data

US 2022/0209551 A1      Jun. 30, 2022

Related U.S. Application Data

(63) Continuation of application No. PCT/CN2020/102288, filed on Jul. 16, 2020.

(30) Foreign Application Priority Data

Oct. 22, 2019    (CN) .......................... 201911008561.5

(51) Int. Cl.
*H02J 7/00*        (2026.01)
*G01R 31/3842*        (2019.01)
(Continued)

(52) U.S. Cl.
CPC .......... *H02J 7/575* (2026.01); *G01R 31/3842* (2019.01); *H01M 10/425* (2013.01);
(Continued)

(58) Field of Classification Search
CPC ...................................................... H02J 7/0024
(Continued)

(56) References Cited

U.S. PATENT DOCUMENTS 6,323,623 B1* 11/2001 Someya ................ H02J 7/0048
320/121
2003/0062874 A1* 4/2003 Furukawa ............. H02J 7/0024
320/121
(Continued)

FOREIGN PATENT DOCUMENTS

CN        101860066 A    10/2010
CN        102593905 A    7/2012
(Continued)

*Primary Examiner* — Yalkew Fantu
(74) *Attorney, Agent, or Firm* — Rimon PC

(57) ABSTRACT

This application provides an electronic device, a charging method, and a charging system for charging two batteries connected in series. The charging integrated circuit controls, based on a target voltage corresponding to each preset period, a charging mode for charging the two batteries. As a charging process is prolonged, the voltages of the two batteries gradually increase, and the target voltage obtained varies with each period. A turning point of switching from constant current charging to constant voltage charging is determined based on the target voltage, and the target voltage is related to the minimum voltage value of the two batteries in each preset period. The charging mode is adjusted based on the target voltage corresponding to each preset period instead of a fixed target voltage. This reduces a probability of battery overcharging and improves battery charging reliability.

17 Claims, 11 Drawing Sheets

(51) Int. Cl.

| | | |
|---|---|---|
| *H01M 10/42* | (2006.01) | |
| *H01M 10/44* | (2006.01) | |
| *H02J 7/50* | (2026.01) | |
| *H02J 7/54* | (2026.01) | |

(52) U.S. Cl.
CPC ............ *H01M 10/441* (2013.01); *H02J 7/54*
(2026.01); *H01M 2010/4271* (2013.01)

(58) Field of Classification Search
USPC ....................................................... 320/117
See application file for complete search history.

(56) References Cited

U.S. PATENT DOCUMENTS

| 2004/0036445 A1* | 2/2004 | Trembley ............. H02J 7/0047 |
|---|---|---|
| | | 320/116 |
| 2005/0116686 A1* | 6/2005 | Odaohhara .......... H02J 7/0013 |
| | | 320/116 |

| 2016/0056655 A1 | 2/2016 | Kaneda et al. |
|---|---|---|
| 2018/0231614 A1* | 8/2018 | Vidal ................... G01R 31/396 |

FOREIGN PATENT DOCUMENTS

| CN | 102761166 A | 10/2012 |
|---|---|---|
| CN | 103248083 A | 8/2013 |
| CN | 203377638 U | 1/2014 |
| CN | 103855747 A | 6/2014 |
| CN | 107834620 A | 3/2018 |
| CN | 107863796 A | 3/2018 |
| CN | 107980191 A | 5/2018 |
| CN | 108736107 A | 11/2018 |
| CN | 110199452 A | 9/2019 |
| EP | 2075894 A2 | 7/2009 |
| EP | 2270951 A1 | 1/2011 |
| JP | H06233468 A | 8/1994 |
| JP | 2002238179 A | 8/2002 |
| JP | 2005322592 A | 11/2005 |
| JP | 2010246225 A | 10/2010 |
| WO | 2013008408 A1 | 1/2013 |

* cited by examiner

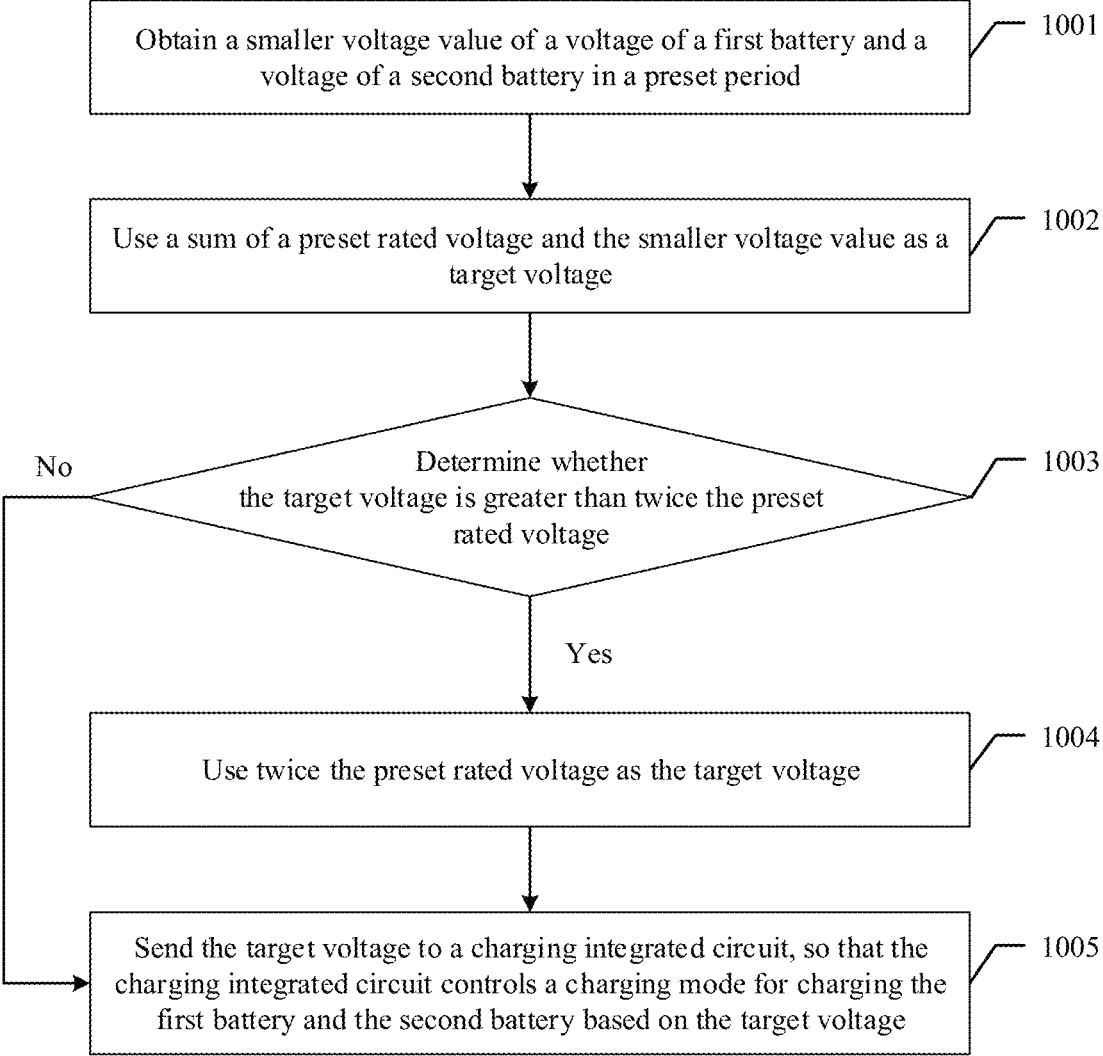

Obtain a smaller voltage value of a voltage of a first battery and a voltage of a second battery in a preset period — 1001

Use a sum of a preset rated voltage and the smaller voltage value as a target voltage — 1002

Determine whether the target voltage is greater than twice the preset rated voltage — 1003

No

Yes

Use twice the preset rated voltage as the target voltage — 1004

Send the target voltage to a charging integrated circuit, so that the charging integrated circuit controls a charging mode for charging the first battery and the second battery based on the target voltage — 1005

FIG. 10

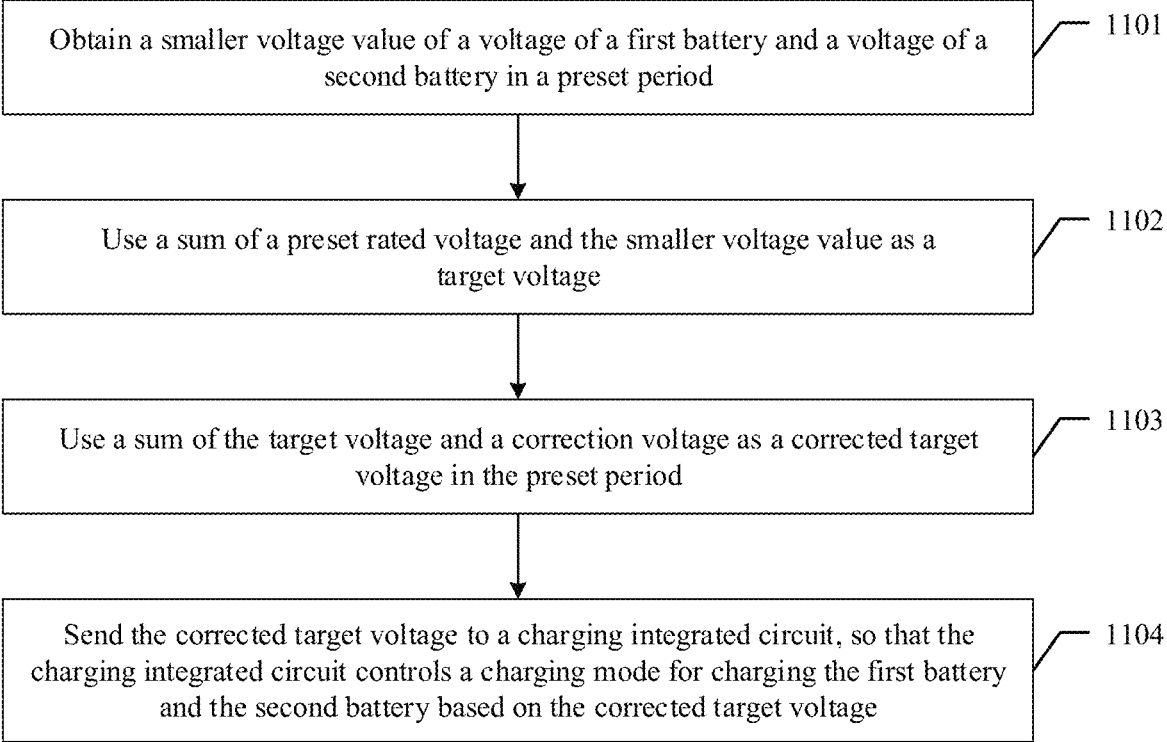

Obtain a smaller voltage value of a voltage of a first battery and a voltage of a second battery in a preset period — 1101

Use a sum of a preset rated voltage and the smaller voltage value as a target voltage — 1102

Use a sum of the target voltage and a correction voltage as a corrected target voltage in the preset period — 1103

Send the corrected target voltage to a charging integrated circuit, so that the charging integrated circuit controls a charging mode for charging the first battery and the second battery based on the corrected target voltage — 1104

FIG. 11

ELECTRONIC DEVICE, CHARGING METHOD, AND CHARGING SYSTEM FOR CHARGING BATTERIES IN SERIES

CROSS-REFERENCE TO RELATED APPLICATIONS

This application is a continuation of International Application No. PCT/CN2020/102288, filed on Jul. 16, 2020, which claims priority to Chinese Patent Application No. 201911008561.5, filed on Oct. 22, 2019. The disclosures of the aforementioned applications are hereby incorporated by reference in their entireties.

TECHNICAL FIELD

This application relates to the field of charging technologies, and in particular, to an electronic device, a charging method, and a charging system.

BACKGROUND

Usually, an electronic device may be charged by loading only a single battery on the electronic device. The electronic device may be a portable electronic device like a mobile phone or a tablet computer, or may be an intelligent wearable electronic device like a smart watch, or may be an electronic device that mainly provides a display function, for example, an electronic display device in a subway passage. The battery loaded on the electronic device needs to be charged before supplying power to the electronic device. Based on a requirement of a charging rate of the electronic device, available duration, or flexibility of a battery layout, on some electronic devices a single battery is gradually being replaced by a plurality of batteries as a charging implementation. When the plurality of batteries are used on the electronic device to supply power to the electronic device, not only can an overall capacity of the batteries on the electronic device be improved, but also the charging rate of the electronic device can be improved, so that the user experience is improved.

Battery overcharging means that a voltage of a battery exceeds a rated operating voltage of the battery when the battery is charged. Battery overcharging creates a charging safety hazard, increases an aging speed of the battery, and shortens the battery's lifespan. Therefore, in the use of the electronic device, overcharging needs to be avoided as much as possible when the battery is charged.

Currently, for a multi-battery structure, there is no reliable technical solution for preventing battery overcharging.

SUMMARY

To resolve the foregoing technical problems in the conventional technology, this application provides an electronic device, a charging method, and a charging system, so as to prevent a battery on the electronic device from being overcharged, to reduce a charging safety hazard, and to reduce the adverse impact of overcharging on battery lifespan.

A first aspect of this application provides an electronic device, including a first battery, a second battery, a charging integrated circuit, and a controller.

An input end of the charging integrated circuit is connected to a power adapter, an output end of the charging integrated circuit is connected to a positive electrode of the first battery, a negative electrode of the first battery is connected to a positive electrode of the second battery, and a negative electrode of the second battery is grounded.

The controller is configured to obtain the lesser voltage value Vmin of the respective voltages of the first battery and the second battery in a preset periodicity, and use a sum of a preset rated voltage Vfull and the smaller of the two Vmin values as a target voltage Vtarget. An expression of the target voltage Vtarget is as follows:

$$Vtarget = Vfull + Vmin$$

The controller is further configured to send the target voltage Vtarget corresponding to each preset period to the charging integrated circuit, so that the charging integrated circuit controls, based on the target voltage Vtarget, a charging mode for charging the first battery and the second battery.

In this embodiment of this application, the charging integrated circuit specifically controls, based on the target voltage Vtarget provided by the controller, the charging mode for charging the two batteries connected in series. Specifically, the charging integrated circuit may control a constant current mode for charging the two batteries connected in series, or control a constant voltage mode for charging the two batteries connected in series. The target voltage Vtarget is set based on the actual minimum voltage value Vmin of the two batteries in the preset period. Therefore, the charging integrated circuit can dynamically and flexibly control the charging mode in real time based on the target voltage Vtarget in different preset periods. This prevents battery overcharging caused by inappropriate control of the charging mode. It can be learned that the electronic device provided in this embodiment of this application can effectively avoid battery overcharging, improve reliability of charging the batteries, reduce a charging safety hazard, and reduce the adverse impact of overcharging on battery lifespan.

Optionally, in the foregoing technical solution, the charging integrated circuit of the electronic device can obtain a terminal voltage generated after the first battery and the second battery are connected in series, and when the terminal voltage reaches the target voltage Vtarget, control the charging mode to switch from constant current charging to constant voltage charging. In other words, before the terminal voltage reaches the target voltage Vtarget, the two batteries are charged in the constant current mode. When the terminal voltage reaches the target voltage Vtarget, the constant current mode switches to the constant voltage mode for charging the two batteries.

An impedance exists between a voltage sampling point of a battery and an electrochemical cell of the battery, and an impedance exists in a connection line between respective electrochemical cells of the batteries connected in series. As a result, when a charging current is larger, the terminal voltage floats more dramatically after the batteries are connected in series. Therefore, a charging IC timely controls the charging mode to switch to the constant voltage mode. This slows down the charging speed. In this embodiment of this application, the target voltage Vtarget may be corrected in the following manner, to reduce impact of terminal voltage floating on the charging speed.

Optionally, in the foregoing technical solution, the controller of the electronic device is further configured to: use a sum of the target voltage Vtarget and a correction voltage as a corrected target voltage Vtarget_r, and send the corrected target voltage Vtarget_r to the charging integrated circuit in the preset period. The correction voltage is a product of a charging line impedance and a charging current collected in the preset period. The charging line impedance includes an impedance Ra between a sampling point of a terminal and an electrochemical cell of the first battery and an impedance (Rb+Rc) between the electrochemical cell of the first battery and an electrochemical cell of the second battery.

An expression of the corrected target voltage Vtarget_r is as follows:

$$Vtarget\_r = Vtarget + (Ra + Rb + Rc) \times I$$

(Ra+Rb+Rc)×I is the correction voltage. Ra is the impedance between the sampling point of the terminal and the electrochemical cell of the first battery. (Rb+Rc) is the impedance between the electrochemical cell of the first battery and the electrochemical cell of the second battery. I is the charging current.

The corrected target voltage Vtarget_r is greater than the uncorrected target voltage Vtarget, so that compensation is implemented for the target voltage. Therefore, after the controller sends the corrected target voltage Vtarget_r to the charging integrated circuit, the charging integrated circuit switches the charging mode based on the corrected target voltage Vtarget_r. In this way, a mode switching time is delayed, and the constant voltage charging is prevented from starting prematurely.

Optionally, in the foregoing technical solution, the electronic device further includes a first switch and a second switch. The first switch and a resistor are connected in series first and then connected in parallel to two ends of the first battery. The second switch and the resistor are connected in series first and then connected in parallel to two ends of the second battery.

The controller of the electronic device is further configured to: when a larger voltage value Vmax of the voltage of the first battery and the voltage of the second battery is greater than a first preset voltage Vtrigger, and a voltage difference between the first battery and the second battery is greater than a second preset voltage Vdelta, control a switch connected in parallel to a battery corresponding to the larger voltage value Vmax to be repeatedly closed and opened, and collect the voltage of the first battery and the voltage of the second battery each time the switch is opened, until the voltage difference between the first battery and the second battery is less than a third preset voltage Vdone. It should be noted that the first preset voltage Vtrigger is less than the preset rated voltage Vfull, the first preset voltage Vtrigger is greater than the second preset voltage Vdelta, and the second preset voltage Vdelta is greater than the third preset voltage Vdone.

When the larger voltage value Vmax is greater than the first preset voltage Vtrigger, it indicates that the battery corresponding to the larger voltage value Vmax is about to be fully charged. If the voltage difference between the first battery and the second battery is greater than the second preset voltage Vdelta, it indicates that the voltage difference between the two batteries is excessively large, and balanced charging needs to be performed. Therefore, in the foregoing technical solution, the switch connected in parallel to the battery corresponding to the larger voltage value Vmax in the first switch and the second switch is controlled to be repeatedly closed and opened, so that currents flowing through the two batteries are unequal, to implement balanced charging. Through balanced charging, the two batteries connected in series can be fully charged as synchronously as possible. In this way, overall charging duration of the two batteries is shortened.

Optionally, in the foregoing technical solution, the charging integrated circuit of the electronic device may further include a third switch. The third switch is connected in series to a charging path of the first battery and the second battery. In other words, when the third switch in the charging integrated circuit is closed, the charging integrated circuit charges the first battery and the second battery. When the third switch is opened, the charging integrated circuit stops charging the first battery and the second battery.

In the electronic device, the controller is further configured to send a disconnection control signal to the charging integrated circuit when determining that the voltage difference between the first battery and the second battery is greater than the second preset voltage Vdelta and the charging current is less than a first preset current Iterm1, so that the charging integrated circuit controls the third switch to be opened; and further configured to send a connection control signal to the charging integrated circuit when the switch connected in parallel to the battery corresponding to the larger voltage value Vmax is closed, so that the charging integrated circuit controls the third switch to be closed, where a subsequent on/off state of the third switch is consistent with an on/off state of the switch connected in parallel to the battery corresponding to the larger voltage value.

When the charging current is less than the first preset current Iterm1, the charging process is nearly complete. In this case, the battery with a relatively high voltage is about to be fully charged. However, because the voltage difference between the two batteries is still greater than the second preset voltage Vdelta, balanced charging further needs to be performed. In this implementation, while balance is performed, the switch connected in parallel to the battery corresponding to the larger voltage value Vmax and the third switch are kept operating in the same on/off state. Each time the third switch is opened, no charging current flows through the first battery and the second battery, and the controller is further configured to collect the voltage of the first battery and the voltage of the second battery by using a voltage collection device (for example, an analog-to-digital converter). In this case, because the third switch is opened, the collected voltages of the two batteries are more accurate, and accuracy is not affected by interference of the charging current. Further, the controller may set the target voltage Vtarget based on a more precise voltage value, and send the target voltage Vtarget to the charging integrated circuit to control the charging mode.

When the charging current is less than a second preset current Idone, it indicates that the two batteries are nearly fully charged. Optionally, in the foregoing technical solution, the controller of the electronic device is further configured to: when determining that the charging current is less than the second preset current Idone, control the charging integrated circuit to stop charging the first battery and the second battery. This avoids a risk of accelerated battery aging or overcharging caused by continuous charging.

An embodiment of this application further provides an implementation of avoiding overcharging. The controller of the electronic device is further configured to: when determining that the target voltage Vtarget is greater than twice the preset rated voltage Vfull, use twice the preset rated voltage Vfull as the target voltage Vtarget. This changes a voltage switching point at which the charging integrated circuit controls charging mode switching. In addition, because the preset rated voltage of each battery is Vfull, setting the target voltage to 2×Vfull does not cause further overcharging of the battery.

Optionally, in the foregoing technical solution, the electronic device further includes a first analog-to-digital converter and a second analog-to-digital converter.

The first analog-to-digital converter is configured to collect the voltage of the first battery, convert the voltage of the first battery into a first digital signal, and send the first digital signal to the controller. The second analog-to-digital converter is configured to collect the voltage of the second battery, convert the voltage of the second battery into a second digital signal, and send the second digital signal to the controller.

A second aspect of this application provides a charging method, applied to charging a first battery and a second battery that are connected in series. The method includes:

obtaining a smaller voltage value Vmin of a voltage of the first battery and a voltage of the second battery in a preset period; and using a sum of a preset rated voltage Vfull and the smaller voltage value Vmin as a target voltage Vtarget, and sending the target voltage Vtarget corresponding to each preset period to a charging integrated circuit of an electronic device, so that the charging integrated circuit controls, based on the target voltage Vtarget, a charging mode for charging the first battery and the second battery.

An expression of the target voltage Vtarget is as follows:

$$Vtarget=Vfull+Vmin$$

In this embodiment of this application, the charging integrated circuit specifically controls, based on the target voltage Vtarget provided by the controller, the charging mode for charging the two batteries connected in series. Specifically, the charging integrated circuit may control a constant current mode for charging the two batteries connected in series, or control a constant voltage mode for charging the two batteries connected in series. The target voltage Vtarget is set based on the actual minimum voltage value Vmin of the two batteries in the preset period. Therefore, the charging integrated circuit can dynamically and flexibly control the charging mode in real time based on the target voltage Vtarget in different preset periods. This prevents battery overcharging caused by inappropriate control of the charging mode. It can be learned that the charging method provided in this embodiment of this application can effectively avoid battery overcharging, improve reliability of charging the batteries, reduce a charging safety hazard, and reduce the adverse impact of overcharging on battery lifespan.

Optionally, before sending the target voltage Vtarget to a charging integrated circuit, the method further includes:

using, in the preset period, a sum of the target voltage Vtarget and a correction voltage as a corrected target voltage Vtarget_r, where the correction voltage is a product of a charging line impedance and a charging current collected in the preset period, and the charging line impedance includes an impedance between a sampling point of a terminal and an electrochemical cell of the first battery and an impedance between the electrochemical cell of the first battery and an electrochemical cell of the second battery.

An expression of the corrected target voltage Vtarget_r is as follows:

$$Vtarget\_r=Vtarget+(Ra+Rb+Rc)\times I$$

(Ra+Rb+Rc)×I is the correction voltage. Ra is the impedance between the sampling point of the terminal and the electrochemical cell of the first battery. (Rb+Rc) is the impedance between the electrochemical cell of the first battery and the electrochemical cell of the second battery. I is the charging current.

Optionally the charging method provided in this application further includes the following steps:

when a larger voltage value Vmax of the voltage of the first battery and the voltage of the second battery is greater than a first preset voltage Vtrigger, and a voltage difference between the first battery and the second battery is greater than a second preset voltage Vdelta, controlling a switch connected in parallel to a battery corresponding to the larger voltage value Vmax to be repeatedly closed and opened, and collecting the voltage of the first battery and the voltage of the second battery each time the switch is opened, until the voltage difference between the first battery and the second battery is less than a third preset voltage Vdone.

The first preset voltage Vtrigger is less than the preset rated voltage Vfull, the first preset voltage Vtrigger is greater than the second preset voltage Vdelta, and the second preset voltage Vdelta is greater than the third preset voltage Vdone.

Optionally, the charging integrated circuit includes a third switch, where the third switch is connected in series to a charging path of the first battery and the second battery. The method further includes:

sending a disconnection control signal to the charging integrated circuit when determining that the voltage difference between the first battery and the second battery is greater than the second preset voltage Vdelta and the charging current is less than a first preset current Iterm1, so that the charging integrated circuit controls the third switch to be opened; and sending a connection control signal to the charging integrated circuit when the switch connected in parallel to the battery corresponding to the larger voltage value Vmax is closed, so that the charging integrated circuit controls the third switch to be closed, where a subsequent on/off state of the third switch is consistent with an on/off state of the switch connected in parallel to the battery corresponding to the larger voltage value.

In addition, each time the third switch is opened, the respective voltages of the first battery and the second battery that are collected by a current measurement device (for example, an analog-to-digital converter) are further obtained. Because the voltage is obtained when the third switch is opened, in this case, no charging current flows through the first battery and the second battery, the voltage value is not affected by the charging current, and is more accurate. The voltage value collected in this case is used as a basis for setting the target voltage Vtarget, and the set target voltage Vtarget is more reliable.

Optionally, the method further includes: when determining that the charging current is less than a second preset current Idone, controlling the charging integrated circuit to stop charging the first battery and the second battery. This avoids a risk of accelerated battery aging or overcharging caused by continuous charging.

A third aspect of this application provides a charging system, applied to charging a first battery and a second battery that are connected in series. The charging system includes a charging integrated circuit and a controller.

An input end of the charging integrated circuit is configured to be connected to a power adapter, an output end of the charging integrated circuit is configured to be connected to a positive electrode of the first battery, a negative electrode of the first battery is connected to a positive electrode of the second battery, and a negative electrode of the second battery is grounded.

The controller is configured to: obtain a smaller voltage value Vmin of a voltage of the first battery and a voltage of the second battery in a preset period, use a sum of a preset rated voltage Vfull and the smaller voltage value Vmin as a target voltage Vtarget, and send the target voltage Vtarget corresponding to each preset period to the charging integrated circuit, so that the charging integrated circuit may control, based on the target voltage Vtarget, a charging mode for charging the first battery and the second battery.

An expression of the target voltage Vtarget is as follows:

$$Vtarget = Vfull + Vmin$$

In this embodiment of this application, the charging integrated circuit of the system specifically controls, based on the target voltage Vtarget provided by the controller, the charging mode for charging the two batteries connected in series. Specifically, the charging integrated circuit may control a constant current mode for charging the two batteries connected in series, or control a constant voltage mode for charging the two batteries connected in series. The target voltage Vtarget is set based on the actual minimum voltage value Vmin of the two batteries in the preset period. Therefore, the charging integrated circuit can dynamically and flexibly control the charging mode in real time based on the target voltage Vtarget in different preset periods. This prevents battery overcharging caused by inappropriate control of the charging mode. It can be learned that the system provided in this embodiment of this application can effectively avoid battery overcharging, improve reliability of charging the batteries, reduce a charging safety hazard, and reduce the adverse impact of overcharging on battery lifespan.

Optionally, in the foregoing technical solution, the controller of the charging system is further configured to: use a sum of the target voltage Vtarget and a correction voltage as a corrected target voltage Vtarget_r, and send the corrected target voltage Vtarget_r to the charging integrated circuit in the preset period, where the correction voltage is a product of a charging line impedance and a charging current collected in the preset period, and the charging line impedance includes an impedance between a sampling point of a terminal and an electrochemical cell of the first battery and an impedance between the electrochemical cell of the first battery and an electrochemical cell of the second battery.

An expression of the corrected target voltage Vtarget_r is as follows:

$$Vtarget\_r = Vtarget + (Ra + Rb + Rc) \times I$$

(Ra+Rb+Rc)×I is the correction voltage. Ra is the impedance between the sampling point of the terminal and the electrochemical cell of the first battery. (Rb+Rc) is the impedance between the electrochemical cell of the first battery and the electrochemical cell of the second battery. I is the charging current.

The target voltage is corrected to reduce the impact of terminal voltage floating on a charging rate when the charging current is large. Specifically, when the corrected target voltage Vtarget_r is greater than Vtarget, a time for switching the charging modes by the charging integrated circuit can be delayed, and constant voltage charging can be prevented from being performed prematurely.

Optionally, the system provided in this embodiment of this application further includes a first switch and a second switch. The first switch and a resistor are connected in series first and then connected in parallel to two ends of the first battery. The second switch and the resistor are connected in series first and then connected in parallel to two ends of the second battery.

The controller is further configured to: when a larger voltage value Vmax of the voltage of the first battery and the voltage of the second battery is greater than a first preset voltage Vtrigger, and a voltage difference between the first battery and the second battery is greater than a second preset voltage Vdelta, control a switch connected in parallel to a battery corresponding to the larger voltage value Vmax to be repeatedly closed and opened, and collect the voltage of the first battery and the voltage of the second battery each time the switch is opened, until the voltage difference between the first battery and the second battery is less than a third preset voltage Vdone; and the first preset voltage Vtrigger is less than the preset rated voltage Vfull, the first preset voltage Vtrigger is greater than the second preset voltage Vdelta, and the second preset voltage Vdelta is greater than the third preset voltage Vdone.

In the foregoing implementation, a switch (the first switch or the second switch) connected in parallel to the battery corresponding to the larger voltage value Vmax is repeatedly closed, so that currents flowing through the two batteries are unequal. In this way, the voltage difference between the two batteries is reduced as soon as possible, and a battery with the smaller voltage is charged as soon as possible.

Optionally, the charging integrated circuit in the system includes a third switch.

The third switch is connected in series to a charging path of the first battery and the second battery.

The controller is further configured to send a disconnection control signal to the charging integrated circuit when determining that the voltage difference between the first battery and the second battery is greater than the second preset voltage Vdelta and the charging current is less than a first preset current Iterm1, so that the charging integrated circuit controls the third switch to be opened; and further configured to send a connection control signal to the charging integrated circuit when the switch connected in parallel to the battery corresponding to the larger voltage value Vmax is closed, so that the charging integrated circuit controls the third switch to be closed, where a subsequent on/off state of the third switch is consistent with an on/off state of the switch connected in parallel to the battery corresponding to the larger voltage value.

The on/off state of the third switch is consistent with the on/off state of the switch (the first switch or the second switch) connected in parallel to the battery corresponding to the larger voltage value Vmax. Therefore, when the switch connected in parallel to the battery corresponding to the larger voltage value Vmax is opened, the third switch is also opened. In this case, not only balance is performed, but also it is ensured that no charging current flows through the two batteries. In this case, the voltages of the two batteries are collected, and the obtained voltage values are more accurate and are not affected by the charging current. Optionally, the controller in the system is further configured to: when determining that the target voltage Vtarget is greater than twice the preset rated voltage Vfull, use twice the preset rated voltage Vfull as the target voltage Vtarget. This changes a voltage switching point at which the charging integrated circuit controls charging mode switching. In addition, because the preset rated voltage of each battery is Vfull, setting the target voltage to 2×Vfull does not cause further overcharging of the battery.

Optionally, the system further includes a first analog-to-digital converter and a second analog-to-digital converter.

The first analog-to-digital converter is configured to collect the voltage of the first battery, convert the voltage of the first battery into a first digital signal, and send the first digital signal to the controller. The second analog-to-digital converter is configured to collect the voltage of the second battery, convert the voltage of the second battery into a second digital signal, and send the second digital signal to the controller.

A fourth aspect of this application provides a charging method, applied in charging a first battery and a second battery that are connected in series. The method includes:

periodically obtaining smaller voltage values Vmin of voltages of the first battery and voltages of the second battery respectively in a first charging stage, a second charging stage, and a third charging stage, using a sum of a preset rated voltage Vfull and the smaller voltage value Vmin as a target voltage Vtarget of a current period of a current charging stage, and sending the target voltage Vtarget to a charging integrated circuit of the electronic device, so that the charging integrated circuit controls, based on the target voltage Vtarget, a charging mode for charging the first battery and the second battery;

in the first charging stage, when a larger voltage value Vmax of the voltage of the first battery and the voltage of the second battery is greater than a first preset voltage Vtrigger, and a voltage difference between the first battery and the second battery is greater than a second preset voltage Vdelta, controlling a switch connected in parallel to a battery corresponding to the larger voltage value Vmax to be repeatedly closed and opened, and collecting the voltage of the first battery and the voltage of the second battery each time the switch is opened, until the voltage difference between the first battery and the second battery is less than a third preset voltage Vdone; and when a charging current is less than a first preset current Iterm1, determining whether the voltage difference is greater than the second preset voltage Vdelta, and if the voltage difference is greater than the second preset voltage Vdelta, entering the second charging stage, or if the voltage difference is not greater than the second preset voltage Vdelta, entering the third charging stage;

in a second charging stage, controlling the switch connected in parallel to the battery corresponding to the larger voltage value Vmax to be repeatedly closed and opened, and controlling, by using the charging integrated circuit, a third switch to be repeatedly closed and opened, where an on/off state of the switch connected in parallel to the battery corresponding to the larger voltage value Vmax is consistent with an on/off state of the third switch; and collecting the voltage of the first battery and the voltage of the second battery each time the switch connected in parallel to the battery corresponding to the larger voltage value Vmax and the third switch are opened, until the voltage difference between the first battery and the second battery is less than the third preset voltage Vdone, and entering the third charging stage, where the third switch is connected in series to a charging path of the first battery and the second battery; and in the third charging stage, continuously charging the first battery and the second battery, and when determining that the charging current is less than a second preset current Idone, controlling the charging integrated circuit to stop charging the first battery and the second battery.

Balanced charging of the two batteries is implemented by using the first charging stage, or the first charging stage and the second charging stage. The two batteries can be fully charged as simultaneously as possible, so that an overall charging time of the two batteries is shortened. In addition, in a balanced charging process, the respective voltages of the two batteries are continuously collected, and are used as an important basis for setting the target voltage. Therefore, battery overcharging can also be avoided in the balance process. Charging security and reliability are improved.

Compared with the conventional technology, this application has at least the following advantages.

The electronic device provided in this embodiment of this application includes two batteries that are connected in series, a charging integrated circuit, and a controller. The controller obtains the smaller voltage value of the voltages of the two batteries in a preset period, sets a sum of the preset rated voltage and the smaller voltage value as the target voltage, and sends the target voltage corresponding to each preset period to the charging integrated circuit. Further, the charging integrated circuit controls, based on the target voltage corresponding to each preset period, the charging mode for charging the two batteries. As the charging process is prolonged, the voltages of the two batteries gradually increase, and the target voltage obtained varies with each period. When the charging integrated circuit charges the batteries in a constant voltage charging mode or a constant current charging mode, a point of switching from the constant current charging mode to the constant voltage charging mode is determined based on the target voltage, and the target voltage is related to the minimum voltage value of the two batteries corresponding to each preset period. Therefore, when charging two batteries connected in series, the charging integrated circuit does not switch the charging mode based on a fixed target voltage, but adjusts the charging mode based on the target voltage corresponding to each preset period. This can effectively reduce a probability of battery overcharging. It can be learned that the technical solution can effectively avoid battery overcharging, improve reliability of charging the batteries, reduce a charging safety hazard, and protect the battery from being damaged.

BRIEF DESCRIPTION OF DRAWINGS

FIG. 10 is a flowchart of another charging method according to an embodiment of this application;

FIG. 11 is a flowchart of still another charging method according to an embodiment of this application.

DESCRIPTION OF EMBODIMENTS

To make a person skilled in the art better understand the technical solutions provided in the embodiments of this application, the following describes the technical solutions with reference to the accompanying drawings.

Based on a multi-battery structure in an electronic device, battery overcharging may be avoided in the following manner.

Figure 1:
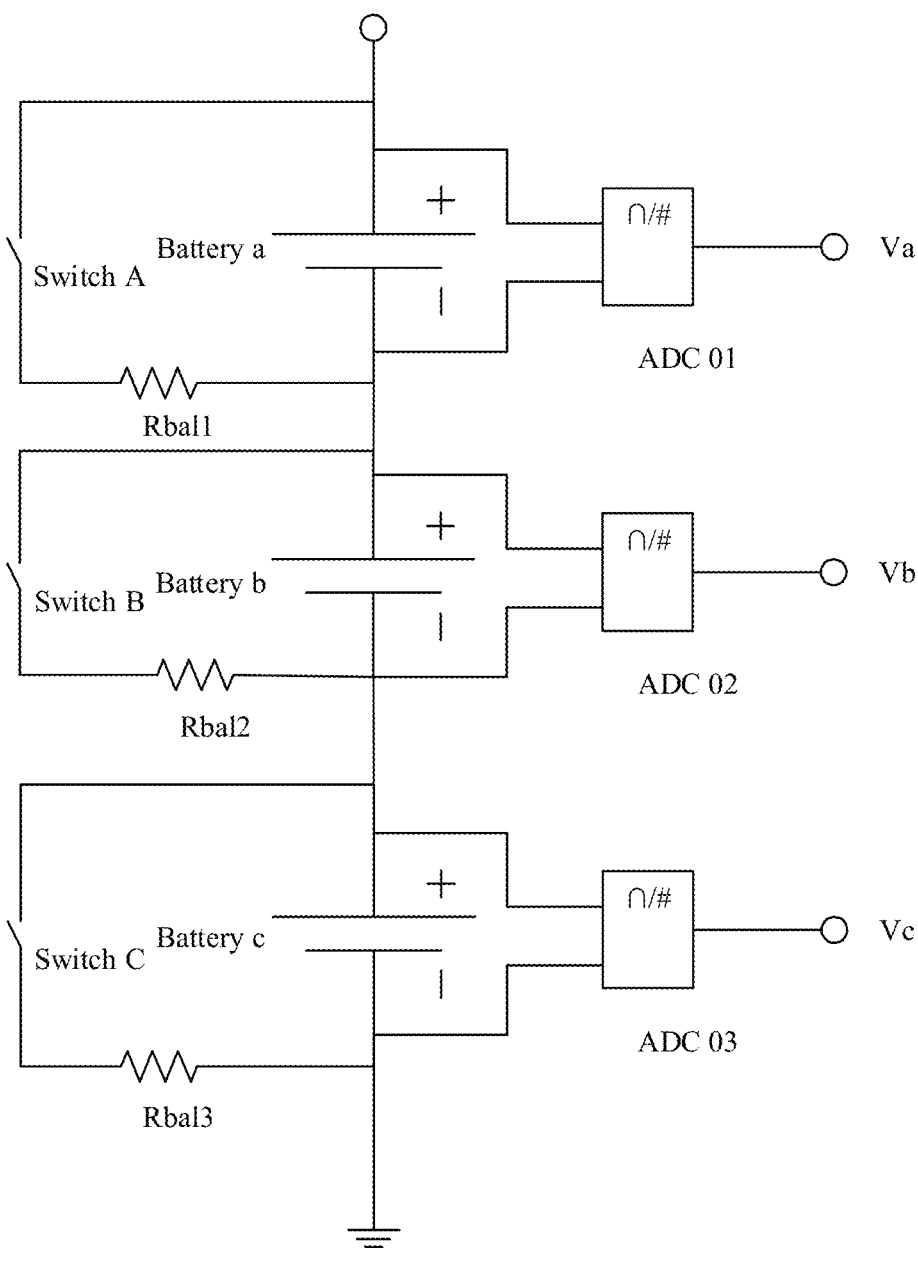
FIG. 1 is a schematic diagram of a circuit connection for charging a plurality of batteries.

The following describes an implementation of avoiding battery overcharging with reference to FIG. 1.

FIG. 1 is a schematic diagram of a circuit connection for charging a plurality of batteries.

As shown in FIG. 1, a plurality of batteries of an electronic device include a battery a, a battery b, and a battery c. The battery a, the battery b, and the battery c are connected in series, a negative electrode of the battery a is connected to a positive electrode of the battery b, a negative electrode of the battery b is connected to a positive electrode of the battery c, a positive electrode of the battery a is configured to be directly or indirectly connected to a power adapter, and a negative electrode of the battery c is grounded.

In FIG. 1, each battery has a corresponding bypass switch, and a bypass resistor is connected in series to each battery bypass switch. A bypass switch corresponding to the battery a is a switch A, and a bypass resistor correspondingly is Rbal1. A bypass switch corresponding to the battery b is a switch B, and a bypass resistor correspondingly is Rbal2. A bypass switch corresponding to the battery c is the switch C, and a bypass resistor correspondingly is Rbal3. Resistance values of the bypass resistors Rbal1, Rbal2, and Rbal3 may be the same or different. In actual application, bypass resistors with the same resistance values may be used, that is, Rbal1=Rbal2=Rbal3. Three analog-to-digital converters (ADC) are respectively configured to collect voltages of the batteries. The analog-to-digital converters ADC 01, ADC 02, and ADC 03 are respectively configured to: collect the voltages of the battery a, the battery b, and the battery c, and respectively transmit voltage values Va, Vb, and Vc obtained through conversion to a controller (not shown in FIG. 1).

In a specific implementation, the controller of the electronic device monitors the voltage value of each battery in real time based on the voltage values Va, Vb, and Vc obtained from the analog-to-digital converters ADCs. When it is determined that a voltage of any battery is higher than a preset voltage threshold, the controller controls the bypass switch of the battery to be closed to perform shunting. For example, when determining that Va is greater than the preset voltage threshold, the controller controls the bypass switch A of the battery a to be closed, so that a part of the current on a charging path flows through the bypass resistor Rbal, and a charging speed of the battery a is reduced by reducing a current flowing through the battery a. When the voltages of the other batteries rise close to Va, the switch A is opened. An on/off state of each bypass switch is controlled in the foregoing manner, and a charging process of the battery is controlled through the bypass current, so as to prevent the battery from being overcharged.

In the foregoing implementation, if the bypass current is too small, a shunting effect is not obvious, and an effect of suppressing battery overcharging is not obvious. If the bypass current is too large, the electronic device may easily heat up. This is unacceptable for small electronic devices such as mobile phones and smart earrings. In addition, if the bypass current is too large, currents between the batteries may accordingly differ too much. In this case, affected by battery internal resistance, a battery voltage value obtained by sampling floats seriously, which greatly increases the difficulty in accurately regulating the voltage to prevent battery overcharging.

The following describes another implementation of avoiding battery overcharging with reference to FIG. 1.

In actual application, battery overcharging may be avoided by alternately charging and discharging the battery. The battery structure shown in FIG. 1 is used as an example, the controller (not shown in FIG. 1) periodically samples a voltage of each battery by using an analog-to-digital converter ADC, and when finding that a voltage of a battery (for example, the battery a) is too high, stops charging the battery of the electronic device, and closes the switch A to discharge the battery a. Battery a is discharged until a voltage value of the battery a is equal to or close to a voltage value of another battery, then charging is restarted for each battery of the electronic device. An entire charging process is so repeated such that the battery is not overcharged.

In the foregoing implementation, discharging further needs to be performed in the charging process. Therefore, a charging rate of the battery is affected, and user experience is further affected. In addition, in the foregoing implementation, it is also difficult to implement accurate control of preventing overcharging in the entire charging process of the battery.

In view of the deficiencies in preventing battery overcharging in the foregoing two implementations, this application further provides an electronic device, a charging method, and a charging system. In each preset period, a target voltage is set based on collected voltage values of two batteries that are connected in series on the electronic device, and a charging mode of the batteries is finally controlled based on the target voltage, so as to precisely and dynamically control the charging process to prevent battery overcharging.

The electronic device may be a portable electronic device like a mobile phone or a tablet computer, may be an intelligent wearable electronic device like a smart watch, or may be an electronic device that mainly provides a display function, for example, a billboard in a subway passage. A type and a function of the electronic device are not limited herein.

Figure 2A:
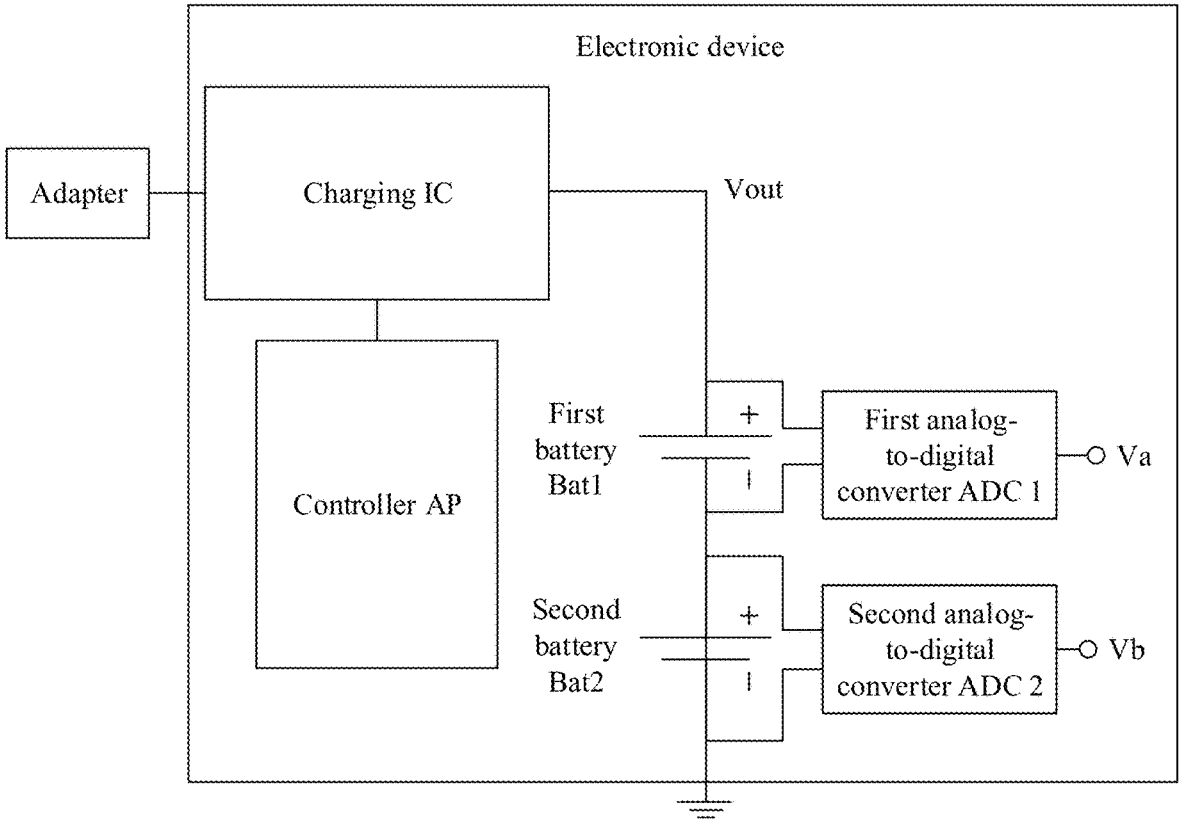
FIG. 2a is a schematic diagram of a circuit connection of an electronic device according to an embodiment of this application.

FIG. 2a is a schematic diagram of a circuit connection of an electronic device according to an embodiment of this application.

As shown in FIG. 2a, the electronic device provided in this embodiment includes:

a first battery Bat1, a second battery Bat2, a charging integrated circuit (IC), and a controller AP.

The first battery Bat1 and the second battery Bat2 are connected in series, a negative electrode of the first battery Bat1 is connected to a positive electrode of the second battery Bat2, and a negative electrode of the second battery Bat2 is grounded. In the electronic device, an input end of the charging IC is configured to be connected to a power adapter, and an output end of the charging IC is configured to be connected to a positive electrode of the first battery Bat1.

The controller AP may be a controller of a central processing unit (CPU) of the electronic device. The controller AP may be integrated in a circuit of the electronic device, or may be separated from the electronic device itself. An implementation form of the controller AP is not limited herein.

The controller AP is configured to: obtain a smaller voltage value Vmin of a voltage of the first battery Bat1 and a voltage of the second battery Bat2 in a preset period, use a sum of a preset rated voltage Vfull and the smaller voltage value Vmin as a target voltage Vtarget, and send the target voltage Vtarget corresponding to each preset period to the charging IC, so that the charging IC controls, based on the target voltage Vtarget, a charging mode for charging the first battery Bat1 and the second battery Bat2. Herein, the voltage of the first battery Bat1 is a voltage between a positive electrode and a negative electrode of the first battery Bat1. The voltage of the second battery Bat2 is a voltage between a positive electrode and a negative electrode of the second battery Bat2. The preset period can be configured before the electronic device is delivered. A smaller period indicates more accurate control. For example, the preset period may be 5 seconds, 15 seconds, 30 seconds, or the like.

In this embodiment, the first battery Bat1 and the second battery Bat2 may be batteries with a same factory specification, and have a same rated voltage Vfull. When the voltage of the first battery Bat1 exceeds the rated voltage Vfull, it is considered that the first battery Bat1 is overcharged. When the voltage of the second battery Bat2 exceeds the rated voltage Vfull, it is considered that the second battery Bat2 is overcharged. For the controller AP, Vfull is used as a preset voltage value used to obtain the target voltage. Therefore, Vfull is further referred to as the preset rated voltage in this application.

As shown in FIG. 2a, the electronic device may further include a first analog-to-digital converter ADC 1 and a second analog-to-digital converter ADC 2. The first analog-to-digital converter ADC 1 is configured to: collect the voltage of the first battery Bat1, convert the voltage of the first battery Bat1 into a first digital signal Va, and send the first digital signal Va to the controller. The second analog-to-digital converter ADC 2 is configured to: collect the voltage of the second battery Bat2, convert the voltage of the second battery Bat2 into a second digital signal Vb, and send the second digital signal Vb to the controller. Va refers to a voltage between both ends of the first battery, and Vb refers to a voltage between both ends of the second battery.

For an expression of the smaller voltage value Vmin, refer to the following formula (1), and for an expression of the larger voltage value Vmax, refer to the following formula (2):

$$Vmin=\min\{Va, Vb\} \hspace{2cm} \text{Formula (1)}$$

$$Vmax=\max\{Va, Vb\} \hspace{2cm} \text{Formula (2)}$$

It can be learned from the foregoing formulas (1) and (2) that when Va is greater than Vb, Vmin=Vb and Vmax=Va; when Va is less than Vb, Vmin=Va and Vmax=Vb; and when Va is equal to Vb, Vmin=Vmax=Va=Vb.

The controller AP sets the target voltage Vtarget according to the following formula (3):

$$Vtarget=Vfull+Vmin \hspace{2cm} \text{Formula (3)}$$

In actual application, after the charging IC starts to charge the first battery Bat1 and the second battery Bat2 that are connected in series, the larger voltage value Vmax of the voltages of the two batteries usually does not exceed the preset rated voltage Vfull. The target voltage Vtarget set according to formula (3) is greater than or equal to a terminal voltage Vout of the first battery Bat1 and the second battery Bat2.

The charging IC is a component that controls charging mode switching, and can control a magnitude of a charging current. In this embodiment, the charging IC is located on a charging path in which the first battery Bat1 and the second battery Bat2 are located, and is configured to control the charging mode for charging the first battery Bat1 and the second battery Bat2. For ease of understanding a function of the charging IC, the following describes the charging IC with reference to an example diagram.

Figure 2B:
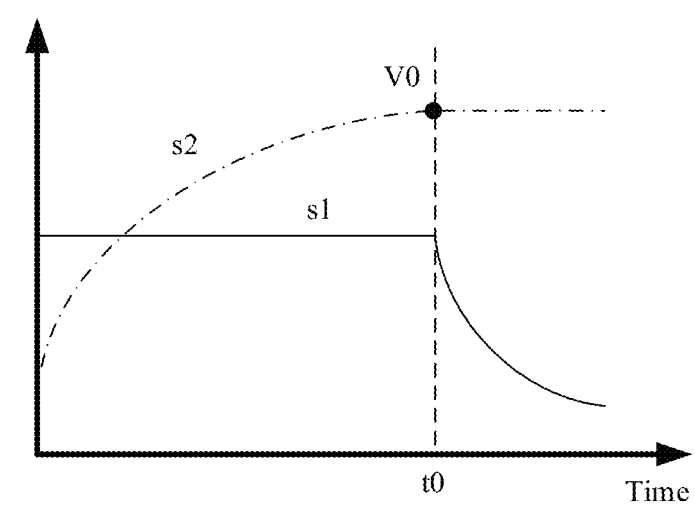
FIG. 2b is a schematic diagram in which a charging integrated circuit controls a charging mode.

FIG. 2b is a schematic diagram in which a charging integrated circuit controls a charging mode. In FIG. 2b, the abscissa represents a charging time, and the ordinate represents a current and a voltage.

In FIG. 2b, a curve s1 drawn by a solid line is a curve indicating that a magnitude of a charging current changes with the charging time under the control of a charging IC. A curve s2 drawn by a dash-dot line is a curve indicating that a terminal voltage changes with the charging time under the control of the charging IC. The terminal voltage refers to a voltage that is of a sampling point of a charged battery combination (a single battery or a multi-battery combination) and that is sampled by the charging IC. A dash-dotted line represents the charging time t0. Before t0, the charging mode is a constant current charging mode in which the charging current remains constant while the terminal voltage keeps increasing. After t0, the charging mode is a constant voltage charging mode in which the terminal voltage remains constant while the charging current continues to decrease.

In FIG. 2b, the terminal voltage corresponding to the charging time t0 is V0. V0 is referred to as a voltage switching point for switching the charging modes. In other words, when the terminal voltage is below V0, the charging IC controls the constant current mode for charging the battery; when the terminal voltage reaches V0, the charging IC controls the constant voltage mode for charging the battery. In other words, when the battery is charged, the charging mode is switched from the constant current mode to the constant voltage mode. FIG. 2b is merely a schematic diagram of explaining and describing a process by which the charging IC controls charging mode switching. The curves s1 and s2 in the figure are not intended to limit implementation of this embodiment of this application.

With reference to FIG. 2b, the charging IC has a function of controlling the constant current mode or the constant voltage mode for charging the battery. In this embodiment, after setting the target voltage Vtarget according to formula (3), the controller AP may directly send the target voltage Vtarget to the charging IC. The charging IC uses the target voltage Vtarget as the voltage switching point that controls charging mode switching. In addition, the charging IC may also automatically collect the terminal voltage Vout of the first battery Bat1 and the second battery Bat2 in real time. Further, the charging IC may control the charging mode of the battery based on the target voltage Vtarget and the terminal voltage Vout. As an example, a model of the charging IC may be a charging integrated circuit of a BQ25882 of Texas Instruments TI, or may certainly be another model of a charging integrated circuit. A manufacturer and a specific model of the charging IC are not limited herein.

In a specific implementation, when the terminal voltage Vout reaches the target voltage Vtarget, the charging IC controls the charging mode to switch from the constant current charging to the constant voltage charging. In other words, when the terminal voltage Vout is less than the target voltage Vtarget, the two batteries are charged in the constant current mode. When the terminal voltage Vout reaches the target voltage Vtarget, the two batteries are charged in the constant voltage mode. It should be noted that, in actual application of this embodiment, controlling the constant voltage mode for charging the first battery Bat1 and the second battery Bat2 means charging the batteries at a relatively stable voltage, instead of ensuring that the charging voltage is absolutely unchanged. For example, a variation amplitude of the charging voltage in the constant voltage mode is not greater than a preset voltage difference. For example, the preset voltage difference is 80 mV. It may be understood that the preset voltage difference may be set based on an actual requirement and a parameter of each component in the electronic device. The preset voltage difference is not specifically limited herein.

The voltage between the two ends of the battery is essentially a sum of a voltage Vo of an electrochemical cell of the battery and a voltage of battery internal resistance. The battery Bat1 is used as an example, and the terminal voltage of the first battery Bat1 is expressed by using a formula: $Va=Vo+I*R$. When the charging mode is switched from the constant current mode to the constant voltage mode, the charging current decreases. It can also be seen from FIG. 2*b* that when I decreases, the voltage of the battery internal resistance I×R decreases. In this case, though Vo increases, Va may remain unchanged, may increase, or may decrease.

It may be understood that, in actual application, the charging IC starts to charge the first battery Bat1 and the second battery Bat2 that are connected in series in the constant current mode, and in a period of time before switching to the constant voltage mode, the voltages of the two batteries that are being charged continuously increase. Correspondingly, Vmin will also continue to increase. Because the target voltage Vtarget is set, even if a battery is first charged to the preset rated voltage, the charging IC timely controls the terminal voltage Vout to be stabilized at the target voltage Vtarget within a current preset period after the terminal voltage Vout reaches the target voltage Vtarget, to prevent either of the two batteries from being overcharged due to a continuous rise of the terminal voltage Vout.

The foregoing describes the electronic device provided in this embodiment of this application. The electronic device includes two batteries Bat1 and Bat2 that are connected in series, a charging IC, and a controller AP. The controller AP obtains the smaller voltage value Vmin of the voltages of the two batteries in the preset period, sets a sum of the preset rated voltage Vfull and the smaller voltage value Vmin as the target voltage Vtarget, and sends the target voltage Vtarget corresponding to each preset period to the charging IC. Further, the charging IC controls, based on the target voltage Vtarget corresponding to each preset period, the charging mode for charging the two batteries. The charging IC has a function of controlling a constant current or a constant voltage in charging the battery. Because the charging IC controls the charging mode based on the corresponding target voltage Vtarget in each preset period, and the target voltage Vtarget is set based on an actual minimum voltage value Vmin of the two batteries in the preset period. Therefore, the charging IC can dynamically and flexibly control the charging mode in real time based on the target voltage Vtarget in different preset periods, so as to prevent battery overcharging caused by inappropriate control of the charging mode. It can be learned that, in the technical solutions of this application, battery overcharging can be effectively avoided, reliability of charging the battery can be improved, a charging safety hazard can be reduced, and the adverse impact of overcharging on battery lifespan can be reduced.

In addition, the electronic device does not suppress battery overcharging by bypass diversion or repeated charging and discharging. Therefore, a heating problem and a charging safety problem caused by an excessively large bypass current can be avoided, and a charging speed of the battery is not affected. In this way, the user experience is improved.

The target voltage Vtarget of each preset period is set by the controller AP based on the sum of the minimum voltage value Vmin of the two batteries and the preset rated voltage Vfull, and the target voltage Vtarget of each preset period after charging is used as an important basis for the charging IC to control charging mode switching. The variable minimum voltage value Vmin, instead of a fixed voltage value or a rated voltage of a battery, is used as a basis for setting the target voltage Vtarget, so that the target voltage Vtarget has a good fault tolerance capability. For example, in actual application, high-low conversion (for example, Va>Vb changes to Vb>Va) may happen to the voltages of the two batteries. In this case, battery overcharging that may happen after high-low conversion happens to the voltages of the two batteries can be suppressed well by using the target voltage Vtarget to control charging mode switching.

An impedance exists between a voltage sampling point of a battery and an electrochemical cell of the battery, and an impedance exists in a connection line between respective electrochemical cells of the batteries connected in series. As a result, when a charging current is larger, the terminal voltage floats more dramatically after the batteries are connected in series. Therefore, a charging IC timely controls the charging mode to switch to the constant voltage mode. This slows down a charging speed.

Based on this, the electronic device provided in this embodiment may further correct the target voltage, so as to resolve a problem that the charging speed is affected by the terminal voltage floating after the batteries are connected in series.

Figure 3:
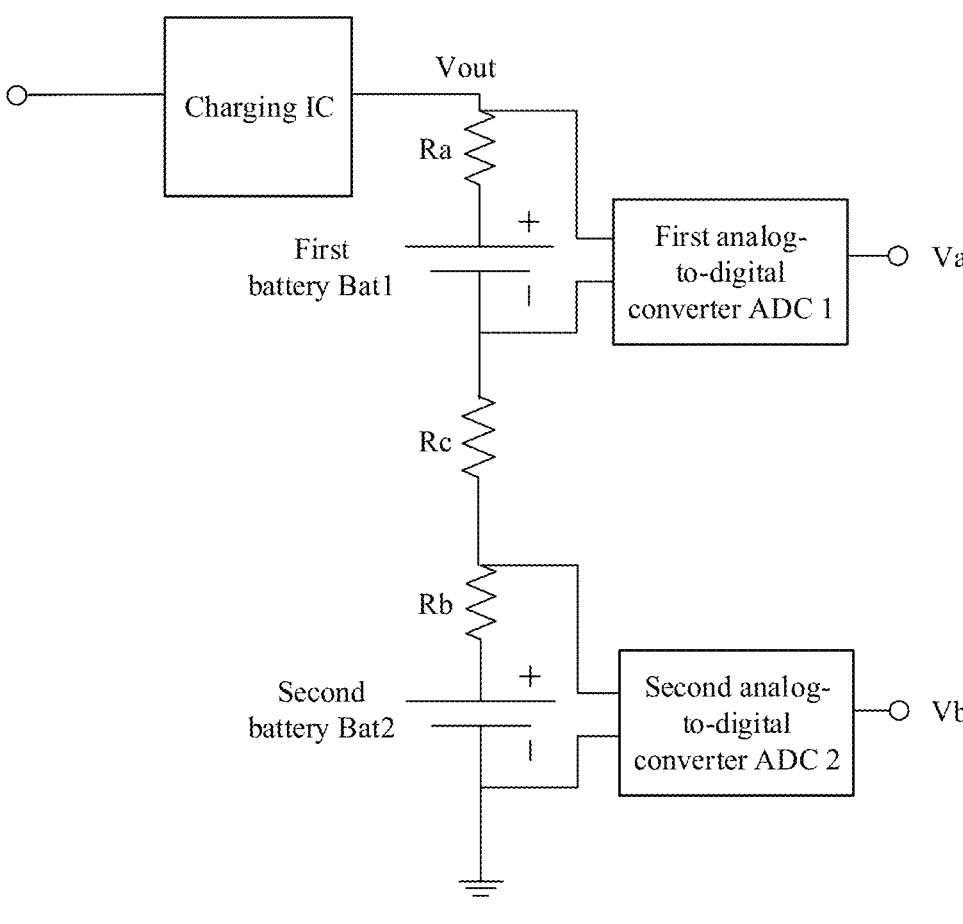
FIG. 3 is a schematic diagram of a circuit connection of another electronic device according to an embodiment of this application.

FIG. 3 is a schematic diagram of a circuit connection of another electronic device according to an embodiment of this application.

As shown in FIG. 3, the charging line impedance includes: a first impedance Ra between a positive voltage sampling point of a first battery Bat1 and an electrochemical cell of the first battery Bat1, a second impedance Rb between a positive voltage sampling point of a second battery Bat2 and an electrochemical cell of the second battery Bat2, and a third impedance Rc in a connection line between the first battery Bat1 and the second battery Bat2. The third impedance Rc is located between a negative voltage sampling point of the first battery Bat1 and the positive voltage sampling point of the second battery Bat2. The positive voltage sampling point of the first battery Bat is also a sampling point of a terminal voltage Vout obtained after the first battery Bat1 and the second battery Bat2 are connected in series.

In this embodiment, the first impedance Ra, the second impedance Rb, and the third impedance Rc may be further classified in the following manner.

The charging line impedance includes: an impedance between the electrochemical cell of the first battery and the sampling point of the terminal voltage Vout obtained after the first battery Bat1 and the second battery Bat2 are connected in series, that is, the first impedance Ra, and an impedance between the electrochemical cell of the first battery Bat1 and the electrochemical cell of the second battery Bat2, specifically including the second resistor Rb and the third resistor Rc.

A controller AP (not shown in FIG. 3) of the electronic device may periodically obtain a charging current I. In a possible implementation, if a charging IC has a function of collecting the charging current I, the controller AP obtains the charging current I based on a preset period by using the charging IC. In another possible implementation, if the charging IC does not have the function of collecting the charging current I, the controller AP may obtain the charging current of the battery by using another component in the electronic device, such as a coulometer or an analog-to-digital converter ADC.

In this embodiment, the controller AP is further configured to: use a product of the charging line impedance and the charging current I collected in the preset period as a correction voltage, use a sum of the target voltage Vtarget and the correction voltage as a corrected target voltage Vtarget_r, and send the corrected target voltage Vtarget_r to the charging IC in the preset period, so that the charging IC controls, based on the corrected target voltage Vtarget_r, a charging mode for charging the first battery Bat1 and the second battery Bat2. An expression for correcting the target voltage Vtarget is as follows:

$$Vtarget\_r = Vtarget + (Ra + Rb + Rc) \times I \qquad \text{Formula (5)}$$

In formula (5), Vtarget is the target voltage, and for an expression of the target voltage, refer to the formula (3) or formula (4). Ra is the first impedance, Rb is the second impedance, Rc is the third impedance, and I is the charging current.

The corrected target voltage Vtarget_r is greater than the uncorrected target voltage Vtarget, so that compensation is implemented for the target voltage. For the charging IC, it is clear that a mode switching time is delayed. For example, at a charging time t1, the terminal voltage Vout reaches Vtarget. In this case, the charging IC does not control the charging mode to switch from a constant current mode to a constant voltage mode. When the terminal voltage Vout reaches the corrected target voltage Vtarget_r at a charging time t2 (t2 is greater than t1), the charging IC controls the charging mode to switch from the constant current mode to the constant voltage mode. Therefore, a time period for which the charging IC charges the batteries in the constant current mode is prolonged, that is, the time period is increased by t2−t1. In a time interval from t1 to t2, the charging IC still charges the battery in the constant current mode. Usually, a charging rate in the constant current mode is faster than a charging rate in the constant voltage mode. Therefore, a charging rate of the battery is increased, so that the battery can be fully charged more quickly, and the user experience is improved.

In actual application, it is usually difficult for the charging IC to control a synchronization rate of charging a plurality of batteries connected in series, and it is likely that one of the batteries connected in series is fully charged first. In this case, to enable the plurality of batteries connected in series on the electronic device to be fully charged synchronously as much as possible, and shorten overall battery charging duration, this application further provides the following implementations for balanced charging of the battery.

Figure 4A:
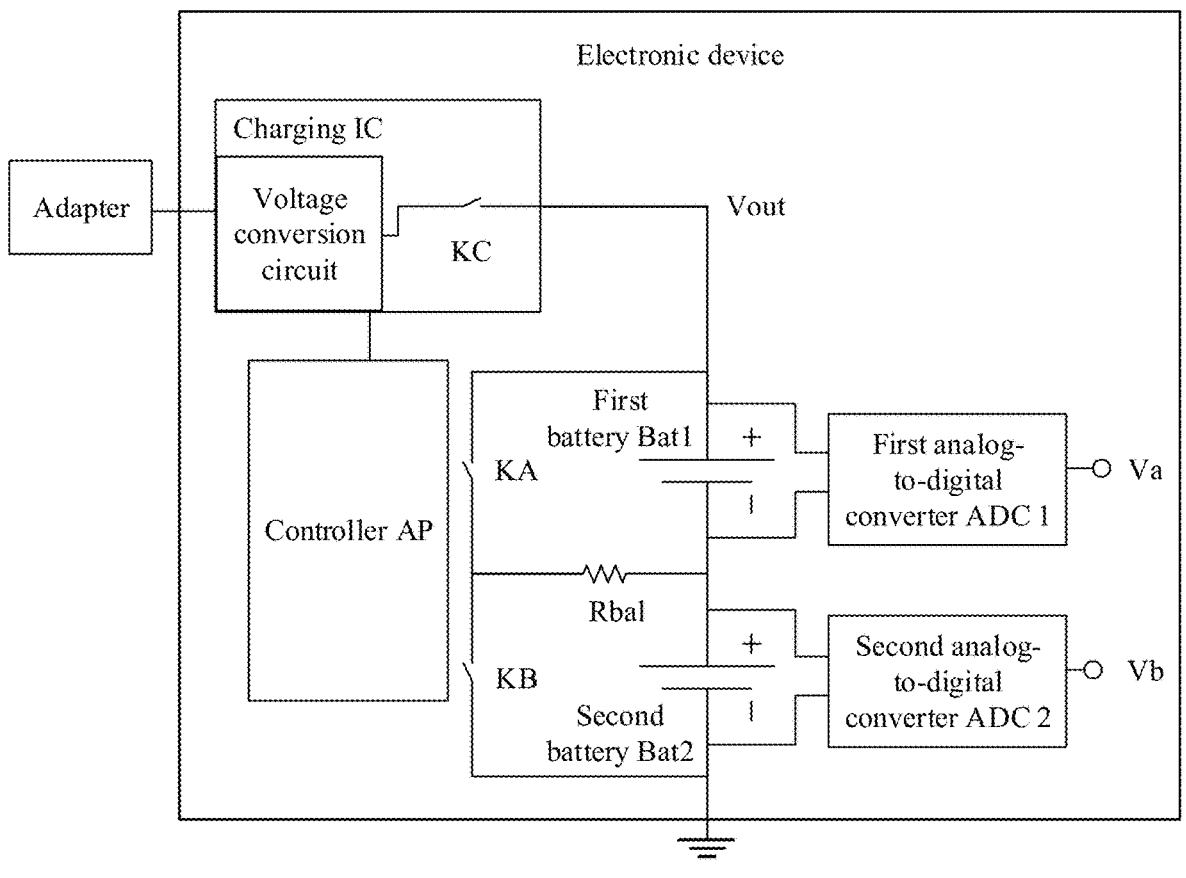
FIG. 4a is a schematic diagram of a circuit connection of still another electronic device according to an embodiment of this application.

FIG. 4a is a schematic diagram of a circuit connection of still another electronic device according to an embodiment of this application.

As shown in FIG. 4a, the electronic device provided in this embodiment includes a first battery Bat1, a second battery Bat2, a charging IC, a controller AP, a first switch KA, a second switch KB, a first analog-to-digital converter ADC 1, a second analog-to-digital converter ADC 2, and a resistor Rbal.

The first switch KA and the resistor Rbal are connected in series first and then connected in parallel to two ends of the first battery Bat1. The second switch KB and the resistor Rbal are connected in series first and then connected in parallel to two ends of the second battery Bat2.

In this embodiment, a plurality of voltage values are preset. A first preset voltage Vtrigger is less than a preset rated voltage Vfull, the first preset voltage Vtrigger is greater than a second preset voltage Vdelta, and the second preset voltage Vdelta is greater than a third preset voltage Vdone.

For example, a preset rated voltage Vfull of each of the first battery Bat1 and the second battery Bat2 is 4.4 V, and the first preset voltage is a value close to and less than the preset rated voltage. For example, the first preset voltage Vtrigger is 4.1 V.

When a larger voltage value Vmax of a voltage Va of the first battery Bat1 and a voltage Vb of the second battery Bat2 is greater than the first preset voltage Vtrigger, that is, max{Va, Vb}>Vtrigger, at least one of the two batteries is about to be fully charged.

A voltage difference between the first battery Bat1 and the second battery Bat2 may be expressed as |Va−Vb|. When the larger voltage value Vmax of the voltage Va of the first battery Bat1 and the voltage Vb of the second battery Bat2 is greater than the first preset voltage Vtrigger, that is, max{Va, Vb}>Vtrigger, and when the voltage difference |Va−Vb| of the first battery Bat1 and the second battery Bat2 is greater than the second preset voltage Vdelta, that is, |Va−Vb|>Vdelta, it indicates that although one battery is about to be fully charged, the voltage difference between the two batteries is large, and it is necessary to enable balanced charging, so that the charging IC can recharge a battery with a smaller voltage in time. For example, the second preset voltage Vdelta is 10 mV.

After balanced charging is enabled, the voltages of the two batteries gradually get closer, and the voltage difference |Va−Vb| between the first battery Bat1 and the second battery Bat2 decreases. When the voltage difference |Va−Vb| is less than the third preset voltage Vdone, that is, |Va−Vb|<Vdone, it can be determined that the voltage difference between the two batteries is small enough and battery levels are close enough to end the balance. For example, the third preset voltage Vdone is 5 mV.

For ease of understanding, the following describes a specific process of the balanced charging.

In specific implementation, the controller AP of the electronic device is further configured to: when the larger voltage value Vmax of the voltage Va of the first battery Bat1 and the voltage Vb of the second battery Bat2 is greater than the first preset voltage Vtrigger, and the voltage difference between the first battery Bat1 and the second battery Bat2 is greater than the second preset voltage Vdelta, control a switch connected in parallel to a battery corresponding to the larger voltage value Vmax to be repeatedly closed and opened, and collect the voltage Va of the first battery Bat1 and the voltage Vb of the second battery Bat2 each time the switch is opened, until the voltage difference between the first battery Bat1 and the second battery Bat2 is less than the third preset voltage Vdone.

As an example, if Vmax=Va, Vmax>Vtrigger, and |Va−Vb| is greater than Vdelta, for example, Va=4.4 V, Vb=4.35 V, Vdelta=10 mV, and it is clear that |Va−Vb|=50 mV>10 mV, the controller AP controls the first switch KA to be closed and the second switch KB to be open, so that a current flowing through the first battery Bat1 is not equal to a current flowing through the second battery Bat2. It is clear that the current flowing through the Bat1 is less than the current flowing through the Bat2. Therefore, the voltage difference between the two batteries Bat1 and Bat2 is reduced. After a period of time Tbal, the controller AP controls the first switch KA to be opened. In the repeated opening and closing process of the first switch KA, the second switch KB is always opened.

It may be understood that, when the first switch KA is closed, the first battery Bat1 may be discharged. This further causes the currents of the two batteries to be unequal, to shorten the voltage difference between the two batteries as soon as possible.

When the first switch KA is opened, collecting Va and Vb can ensure that voltage collection environments of the two batteries are consistent. This reduces a collection error and a calculation error, and improves precision of charging control in a balance process. To improve stability and accuracy of collecting Va and Vb, Va and Vb may be further collected after the first switch KA is opened for a period of time Trelax.

In another example, if Vmax=Vb, Vmax>Vtrigger, and |Va−Vb| is greater than Vdelta, the controller AP controls the second switch KB to be closed. The current flowing through the first battery Bat1 is not equal to the current flowing through the second battery Bat2. Compared with the current flowing through the second battery Bat2, the current flowing through the first battery Bat1 is larger, so as to charge the first battery Bat1, and promote power balance as soon as possible. After a period of time Tbal, the controller AP controls the second switch KB to be opened. In the repeated opening and closing process of the second switch KB, the first switch KA is always opened. When the second switch KB is opened, collecting Va and Vb can ensure that voltage collection environments of the two batteries are consistent. This reduces a collection error and a calculation error, and improves precision of charging control in the balance process. To improve stability and accuracy of collecting Va and Vb, Va and Vb may be further collected after the second switch KB is opened for a period of time Trelax.

In a balance process, each time after Va and Vb are collected after the switch connected in parallel to the battery corresponding to the larger voltage value Vmax is opened, the voltage difference |Va−Vb| may be compared with the third preset voltage Vdone. If the voltage difference |Va−Vb| is less than the third preset voltage Vdone, it indicates that the voltage difference between the two batteries is small enough, and in this case, the balance process may be stopped. However, if the voltage difference |Va−Vb| is greater than or equal to the third preset voltage Vdone, it indicates that the voltage difference between the two batteries is still not small enough, and there is still a large difference between the power levels of the two batteries. In this case, the foregoing repeated closing and opening operations of the switch (the first switch KA or the second switch KB) connected in parallel to the battery corresponding to the larger voltage value Vmax further need to be repeated, so as to continuously perform balanced charging on the batteries.

When the voltages of the two batteries are collected, the charging IC continues to charge the two batteries. As a result, charging currents still flow through the two batteries. This may still affect accuracy of battery voltage collection. To further improve sampling accuracy and improve precision of collected Va and Vb, the electronic device provided in this embodiment of this application may further include a third switch KC.

As shown in FIG. 4a, the third switch KC is located in the charging IC, and the third switch KC is connected in series to a charging path of the first battery Bat1 and the second battery Bat2. The charging IC includes a voltage conversion circuit, and the voltage conversion circuit is connected to the controller AP, and is connected to the third switch KC. When the charging IC charges two batteries, the third switch KC is closed by default.

The controller AP is further configured to: send a disconnection control signal to the charging IC when determining that the voltage difference |Va−Vb| between the first battery Bat1 and the second battery Bat2 is greater than the second preset voltage Vdelta, and the charging current I is less than the first preset current Iterm1, so that the charging IC controls the third switch KC to be open; and further configured to send a connection control signal to the charging IC when the switch connected in parallel to the battery corresponding to the larger voltage value Vmax is closed, so that the charging IC controls the third switch KC to be closed.

When the charging current I is less than the first preset current Iterm1, charging is nearly ended. It indicates that a battery with a relatively high voltage is about to be fully charged. However, because the voltage difference |Va−Vb| is still greater than the second preset voltage Vdelta, balanced charging further needs to be performed. In this stage of balanced charging, the repeated closing and opening operations of the switch (the first switch KA or the second switch KB) connected in parallel with the battery corresponding to the larger voltage value Vmax are controlled repeatedly. The controller AP sends a signal to the charging IC while controlling the switch to be closed and opened, so that the third switch KC in the charging IC is repeatedly closed and opened. In a process of repeatedly closing and opening the third switch KC, the charging IC charges the first battery Bat1 and the second battery Bat2 only in a period when the third switch KC is closed. In other words, the charging IC charges the two batteries by using a pulsed current.

In the balance process, the switch (the first switch KA or the second switch KB) connected in parallel to the battery corresponding to the larger voltage value Vmax is controlled to be closed, so that the current flowing through the first battery Bat1 is not equal to the current flowing through the second battery Bat2. In this way, the voltage difference between the two batteries is reduced, and voltage balance is achieved.

In other words, if the voltage of the first battery Bat1 is larger, when controlling the first switch KA to be closed, the controller AP further controls, by sending a control signal, the charging IC to control the third switch KC to be closed, or when controlling the first switch KA to be open, the controller AP further controls, by sending a control signal, the charging IC to control the third switch KC to be opened. If the voltage of the second battery Bat2 is larger, when controlling the second switch KB to be closed, the controller AP further controls, by sending a control signal, the charging IC to control the third switch KC to be closed, or when controlling the second switch KB to be open, the controller AP further controls, by sending a control signal, the charging IC to control the third switch KC to be opened.

As mentioned above, in the balance process, Va and Vb are collected on the premise that the switch connected in parallel to the battery corresponding to the larger voltage value Vmax is opened. When the switch is opened, the charging IC also controls the third switch KC to be opened. Therefore, no charging current flows through the two batteries. In this case, the two batteries are neither charged nor discharged, and accuracy of a first digital signal Va sent by the first analog-to-digital converter ADC 1 to the controller AP and a second digital signal Vb sent by the second analog-to-digital converter ADC 2 to the controller AP is improved. It may be understood that because the accuracy of Va and Vb is improved, and both balanced charging control and charging mode (constant current or constant voltage) control depend on Va and Vb, precision of the balanced charging control and the charging mode control are improved. Therefore, the electronic device provided in this embodiment has a relatively good effect of preventing battery overcharging and a relatively good effect of balanced charging, and the battery and the entire electronic device are safer in use.

The controller AP in this embodiment is further configured to: collect the charging current I while collecting Va and Vb, determine values of the charging current I and a second preset current Idone, and when the charging current I is less than the second preset current Idone, control the charging IC to stop charging the first battery Bat1 and the second battery Bat2. The second preset current Idone is less than the first preset current Iterm1. When the charging current I is less than the second preset current Idone, each of the two batteries is finally charged to the rated voltage Vfull.

The electronic device provided in the foregoing embodiment can quickly fully charge at least one battery in a safe and undercharged case. If the user does not unplug a charging cable between the electronic device and a power supply (or an adapter), a battery with a lower voltage among the plurality of batteries may be fully charged successively. The electronic device can avoid battery overcharging, and therefore battery charging safety is improved. In addition, the plurality of batteries are charged evenly, so that the battery has a strong battery life, and the user experience is improved.

The following divides the balanced charging process into three stages for description.

It should be noted that, in the first charging stage, the second charging stage, and the third charging stage described below, the controller AP periodically obtains smaller voltage values Vmin of the voltages Va of the first battery Bat1 and the voltages Vb of the second battery Bat2, uses a sum of a preset rated voltage Vfull and the smaller voltage value Vmin as a target voltage Vtarget of a current period of a current charging stage, and sends the target voltage Vtarget to a charging IC, so that the charging IC controls, based on the target voltage Vtarget, a charging mode for charging the first battery Bat1 and the second battery Bat2. In other words, the charging IC controls charging mode switching based on the target voltage Vtarget set by the controller AP in the entire balance process.

For ease of understanding, changes of a charging current and a charging voltage with time in a process of performing balanced charging on a battery are described below with reference to FIG. 4b.

Figure 4B:
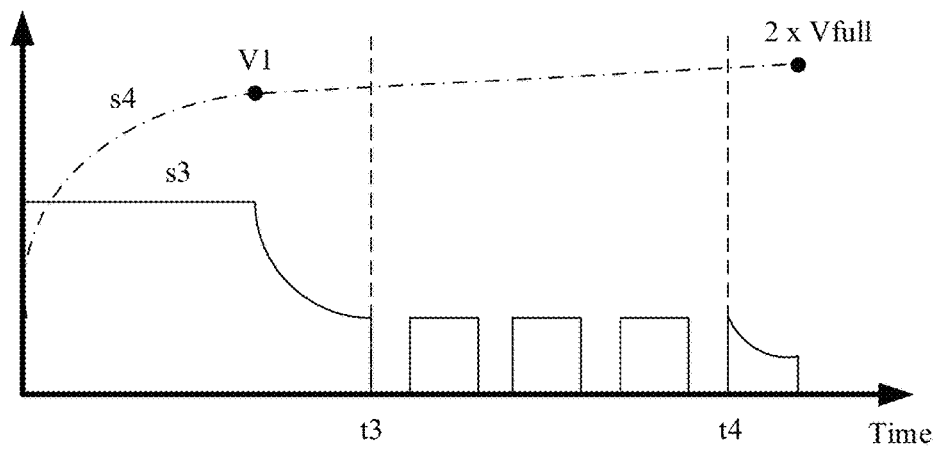
FIG. 4b is a schematic diagram of a charging curve of performing balanced charging on a battery according to an embodiment of this application.

FIG. 4b is a schematic diagram of a charging curve of performing balanced charging on a battery according to an embodiment of this application. In FIG. 4b, the abscissa represents a charging time, and the ordinate represents a current and a voltage.

In FIG. 4b, a curve s3 drawn by a solid line is a curve indicating that a magnitude of a charging current changes with the charging time under the control of a charging IC. A curve s4 drawn by a dash-dot line is a curve indicating that a terminal voltage changes with the charging time under the control of the charging IC.

In the first charging stage, when a larger voltage value Vmax of the voltage of the first battery Bat1 and the voltage of the second battery Bat2 is greater than a first preset voltage Vtrigger, and a voltage difference |Va−Vb| between the first battery Bat1 and the second battery Bat2 is greater than a second preset voltage Vdelta, a switch connected in parallel to a battery corresponding to the larger voltage value Vmax is controlled to be repeatedly closed and opened, and the voltage Va of the first battery Bat1 and the voltage Vb of the second battery Bat2 are collected each time the switch is opened, until the voltage difference |Va−Vb| between the first battery Bat1 and the second battery Bat2 is less than a third preset voltage Vdelta; and when the charging current is less than a first preset current Iterm1, whether the voltage difference |Va−Vb| is greater than the second preset voltage Vdelta is determined, and if the voltage difference |Va−Vb| is greater than the second preset voltage Vdelta, the second charging stage begins, or if the voltage difference |Va−Vb| is not greater than the second preset voltage Vdelta, the third charging stage begins.

In actual application, when the terminal voltage Vout of the two batteries may reach the target voltage Vtarget for the first time in the first charging stage (before t3), the charging IC controls the charging mode to switch to the constant voltage mode for charging. The Vtarget shown in FIG. 4b is only a point of switching to the constant voltage mode. In a preset period after t3, the target voltage Vtarget may increase as the charging continues.

In the second charging stage (a pulse charging stage), the controller AP controls the switch connected in parallel to the battery corresponding to the larger voltage value Vmax to be repeatedly closed and opened, and controls a third switch KC to be repeatedly closed and opened by using the charging IC, where an on/off state of the switch connected in parallel to the battery corresponding to the larger voltage value Vmax is consistent with the on/off state of the third switch KC; and controls the voltage Va of the first battery Bat1 and the voltage Vb of the second battery Bat2 each time the switch connected in parallel to the battery corresponding to the larger voltage value Vmax and the third switch KC are opened, until the voltage difference between the first battery Bat1 and the second battery Bat2 is less than the third preset voltage Vdone, and enters the third charging stage.

In FIG. 4b, a charging time interval from t3 to t4 corresponds to the second charging stage, and the charging current is in a form of an interval pulse, indicating that balance is performed on the battery by repeatedly closing and opening the third switch KC.

In the third charging stage, the first battery Bat1 and the second battery Bat2 are continuously charged, and when determining that the charging current is less than a second preset current Idone, the charging IC is controlled to stop charging the first battery Bat1 and the second battery Bat2.

In FIG. 4b, an interval after a charging time t4 corresponds to the third charging stage, and the charging current gradually decreases, indicating that the first battery Bat1 and the second battery Bat2 are gradually fully charged at a later stage of the balance.

It can be learned from FIG. 4b that although the charging mode is switched to the constant voltage mode, the terminal voltage still slightly increases from the first charging mode switching point V1 to twice the preset rated voltage, that is, 2×Vfull. When the voltage reaches 2×Vfull, both batteries are fully charged. For example, the first charging mode switching point V1 shown in FIG. 4b is 8.65 V, and 2×Vfull is 8.8 V.

In actual application, if a battery environment changes, the preset rated voltage is updated with the environment change, for example, the preset rated voltage becomes smaller. As a result, the voltages of the two batteries exceed the preset rated voltage. In this case, a suppression measure needs to be immediately taken to avoid overcharging. This is because if the target voltage Vtarget continues to be set according to formula (3), the charging mode may not be switched in time. This leads to continuous overcharging.

To resolve this problem, in the electronic device provided in this embodiment of this application, the controller AP may be further configured to: when determining that the target voltage Vtarget is greater than twice the preset rated voltage, use twice the preset rated voltage as the target voltage.

In other words, when (Vfull+Vmin)>2×Vfull, the target voltage Vtarget is reset according to the following formula (4):

$$Vtarget=2 \times Vfull \qquad \text{Formula (4)}$$

The controller AP sets the target voltage Vtarget according to formula (4) and sends the target voltage Vtarget to the charging IC, so that the charging IC can use the target voltage Vtarget as the switching point for controlling charging mode switching in the preset period, to prevent battery overcharging caused by untimely switching to the constant voltage mode.

Based on the electronic device provided in the foregoing embodiment, correspondingly, this application further provides a charging system. The charging system is configured to charge a plurality of batteries connected in series. The following describes specific implementation of the charging system with reference to embodiments and accompanying drawings.

Figure 5:
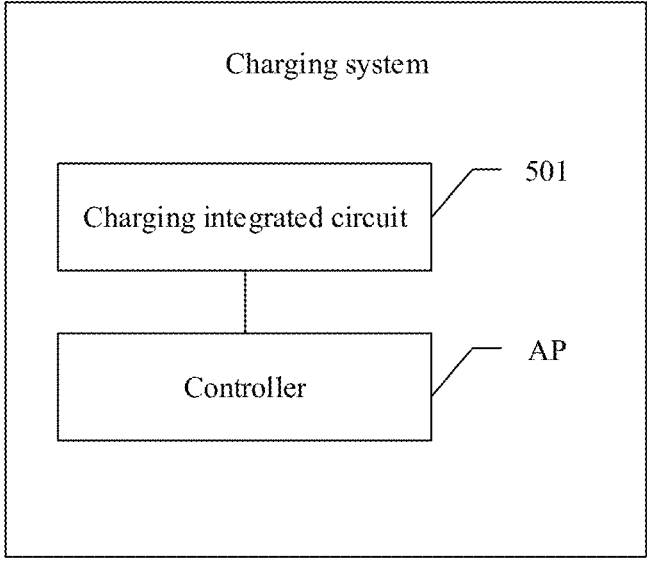
FIG. 5 is a schematic diagram of a structure of a charging system according to an embodiment of this application.

FIG. 5 is a schematic diagram of a structure of a charging system according to an embodiment of this application.

As shown in FIG. 5, the charging system provided in this embodiment includes a charging integrated circuit 501 (charging IC for short) and a controller AP.

The charging integrated circuit 501 is located in the electronic device, and may be specifically integrated inside the electronic device, or may be detachably installed in the electronic device. The controller AP may be a controller of a CPU of the electronic device, or may be a controller independent of the electronic device.

The charging system is configured to charge a first battery and a second battery, and the two batteries are connected in series. An input end of the charging integrated circuit 501 is configured to be connected to a power adapter, an output end of the charging integrated circuit 501 is configured to be connected to a positive electrode of the first battery, a negative electrode of the first battery is connected to a positive electrode of the second battery, and a negative electrode of the second battery is grounded. For a connection relationship between the charging integrated circuit 501 and the charged two batteries in the charging system provided in this embodiment, refer to the schematic diagram of the circuit connection related to the electronic device described in the foregoing embodiment. For details, refer to FIG. 2a to FIG. 4a.

The controller AP is configured to: obtain a smaller voltage value of a voltage of the first battery and a voltage of the second battery in a preset period, use a sum of a preset rated voltage and the smaller voltage value as a target voltage, and send the target voltage corresponding to each preset period to the charging integrated circuit 501, so that the charging integrated circuit 501 controls, based on the target voltage, a charging mode for charging the first battery and the second battery.

The charging integrated circuit 501 has a function of controlling a constant current or a constant voltage in charging a battery. Because the charging integrated circuit 501 controls the charging mode based on the corresponding target voltage in each preset period, and the target voltage is set based on the actual minimum voltage value of the two batteries in the preset period, the charging integrated circuit 501 can dynamically and flexibly control the charging mode in real time based on the target voltage in different preset periods, to prevent battery overcharging caused by inappropriate control of the charging mode. It can be learned that the charging system provided in this embodiment of this application can effectively avoid battery overcharging, improve reliability of charging the batteries, reduce a charging safety hazard, and reduce the adverse impact of overcharging on battery lifespan.

In addition, in the charging system, battery overcharging is not prevented by bypass diversion or repeated charging and discharging. Therefore, a heating problem and a charging safety problem caused by an excessively large bypass current can be avoided, and a charging speed of the battery is not affected. In this way, the user experience is improved.

The target voltage of each preset period is set by the controller AP based on the minimum voltage value of the two batteries and the preset rated voltage, and the target voltage of each preset period after charging is used as an important basis for controlling charging mode switching by the charging integrated circuit 501. The variable minimum voltage, instead of a fixed voltage value or rated voltage of a battery, is used as the basis for setting the target voltage, so that the target voltage has a good fault tolerance capability. For example, in actual application, high-low conversion may happen to the voltages of two batteries. In this case, battery overcharging that may happen after high-low conversion happens to the voltages of the two batteries can be well suppressed by using the target voltage to control charging mode switching.

An impedance exists between a voltage sampling point of a battery and an electrochemical cell of the battery, and an impedance exists in a connection line between respective electrochemical cells of the batteries connected in series. As a result, when a charging current is larger, a terminal voltage floats more dramatically after the batteries are connected in series. Therefore, the charging integrated circuit 501 timely controls the charging mode to switch to the constant voltage mode. This slows down the charging speed.

Based on this, the charging system provided in this embodiment may further correct the target voltage to resolve a problem that the charging speed is affected by terminal voltage floating after the batteries are connected in series.

In the system, the controller AP is further configured to: use a sum of the target voltage and a correction voltage as a corrected target voltage, and send the corrected target voltage to the charging integrated circuit 501 in a preset period. The correction voltage is a product of a charging line impedance and the charging current collected in the preset period. The charging line impedance includes an impedance between a sampling point of a terminal and an electrochemical cell of the first battery and an impedance between the electrochemical cell of the first battery and an electrochemical cell of the second battery.

The corrected target voltage increases relative to the uncorrected target voltage, so as to implement compensation for the target voltage. For the charging integrated circuit 501, it is clear that a speed at which the terminal voltage generated after the batteries are connected in series reaches the corrected target voltage is slowed down, that is, a time point at which the charging mode is switched is correspondingly delayed. In this way, the charging integrated circuit 501 may have more time to charge the battery at a constant current before the constant voltage charging. This improves the charging speed of the battery, so that the battery can be fully charged more quickly, and the user experience is improved.

In actual application, it is usually difficult for the charging integrated circuit 501 to control a synchronization rate of charging a plurality of batteries connected in series, and it is likely that one of the batteries connected in series is fully charged first. In this case, to enable the plurality of batteries connected in series to be fully charged synchronously as much as possible, and shorten overall battery charging duration, this application further provides the following implementations for balanced charging of the battery.

Figure 6:
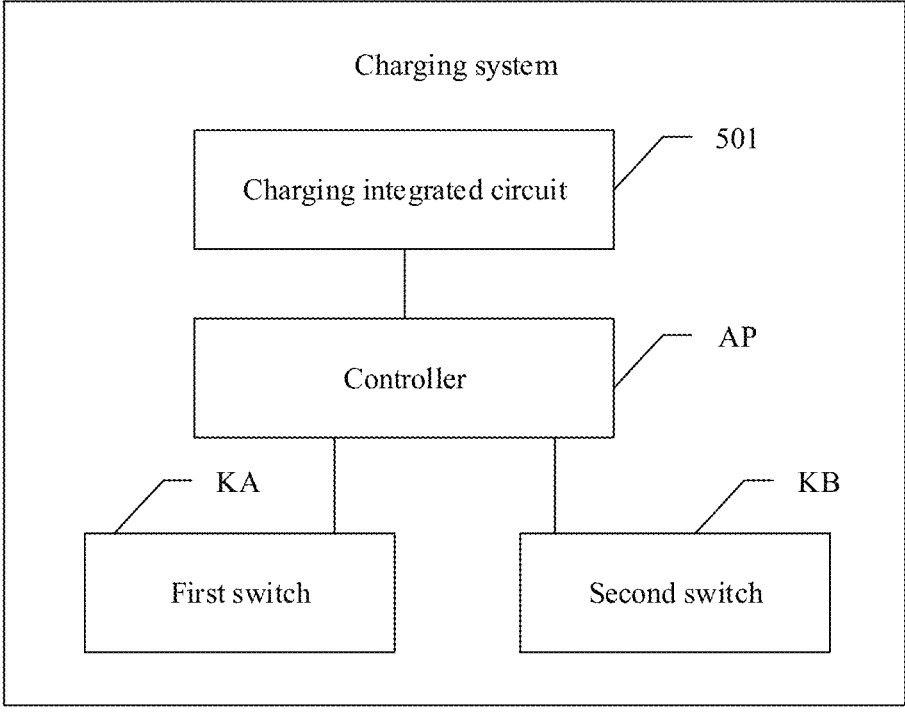
FIG. 6 is a schematic diagram of a structure of another charging system according to an embodiment of this application.

FIG. 6 is a schematic diagram of a structure of another charging system according to an embodiment of this application.

As shown in FIG. 6, the charging system includes a charging integrated circuit 501 and a controller AP, and further includes a first switch KA and a second switch KB.

The first switch and a resistor are connected in series first and then connected in parallel to two ends of the first battery. The second switch and the resistor are connected in series first and then connected in parallel to two ends of the second battery.

The controller AP is further configured to: when a larger voltage value of a voltage of the first battery and a voltage of the second battery is greater than a first preset voltage, and a voltage difference between the first battery and the second battery is greater than a second preset voltage, control a switch connected in parallel to a battery corresponding to the larger voltage value to be repeatedly closed and opened, and collect the voltage of the first battery and the voltage of the second battery each time the switch is opened, until the voltage difference between the first battery and the second battery is less than a third preset voltage.

The first preset voltage is less than a preset rated voltage, the first preset voltage is greater than the second preset voltage, and the second preset voltage is greater than the third preset voltage.

In the foregoing manner, the two batteries connected in series are evenly charged, so that a battery with a relatively low voltage can be quickly charged. This improves an overall battery life of the two batteries.

When the voltages of the two batteries are collected, the charging IC continues to charge the two batteries. As a result, charging currents still flow through the two batteries. This may still affect accuracy of battery voltage collection.

To further improve sampling accuracy and improve precision of collected Va and Vb, an embodiment of this application further provides still another charging system.

Figure 7:
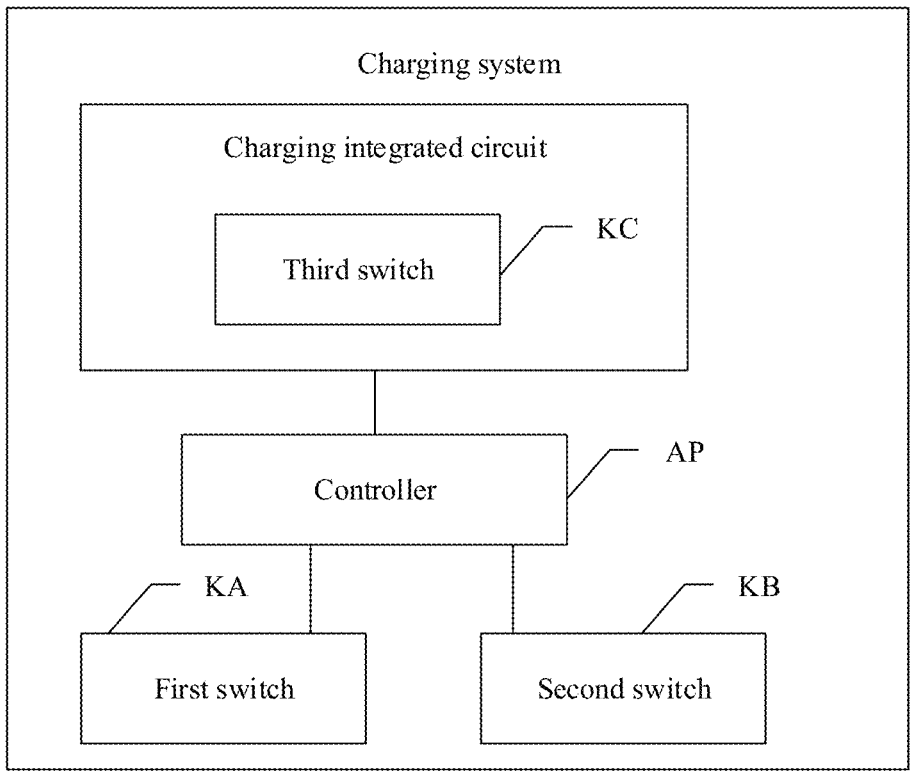
FIG. 7 is a schematic diagram of a structure of still another charging system according to an embodiment of this application.

FIG. 7 is a schematic diagram of a structure of still another charging system according to an embodiment of this application.

As shown in FIG. 7, compared with the charging system shown in FIG. 6, the charging system further includes a third switch KC on a basis of the charging integrated circuit 501.

The third switch KC is connected in series to a charging path of a first battery and a second battery. For a connection relationship between the third switch and another component in the circuit, refer to FIG. 4a.

The controller AP is further configured to: when determining that the voltage difference between the first battery and the second battery is greater than the second preset voltage and the charging current is less than a first preset current, send a disconnection control signal to the charging integrated circuit, so that the charging integrated circuit controls the third switch to be opened; and is further configured to send a connection control signal to the charging integrated circuit when the switch connected in parallel to the battery corresponding to the larger voltage value is closed, so that the charging integrated circuit controls the third switch to be closed.

As mentioned above, in a balance process, Va and Vb are collected on the premise that the switch connected in parallel to the battery corresponding to the larger voltage value is opened. Because when the switch is opened, the charging integrated circuit 501 also controls the third switch KC to be opened, so that no charging current flows through the two batteries. In this way, the obtained voltages Va and Vb of the two batteries are more accurate. It may be understood that because accuracy of Va and Vb is improved, and both balanced charging control and charging mode (constant current or constant voltage) control depend on Va and Vb, precision of the balanced charging control and charging mode control are improved. Therefore, the charging system provided in this embodiment has a relatively good effect of preventing battery overcharging and a relatively good effect of balanced charging, and the battery and the charging system are safer in use.

Figure 8:
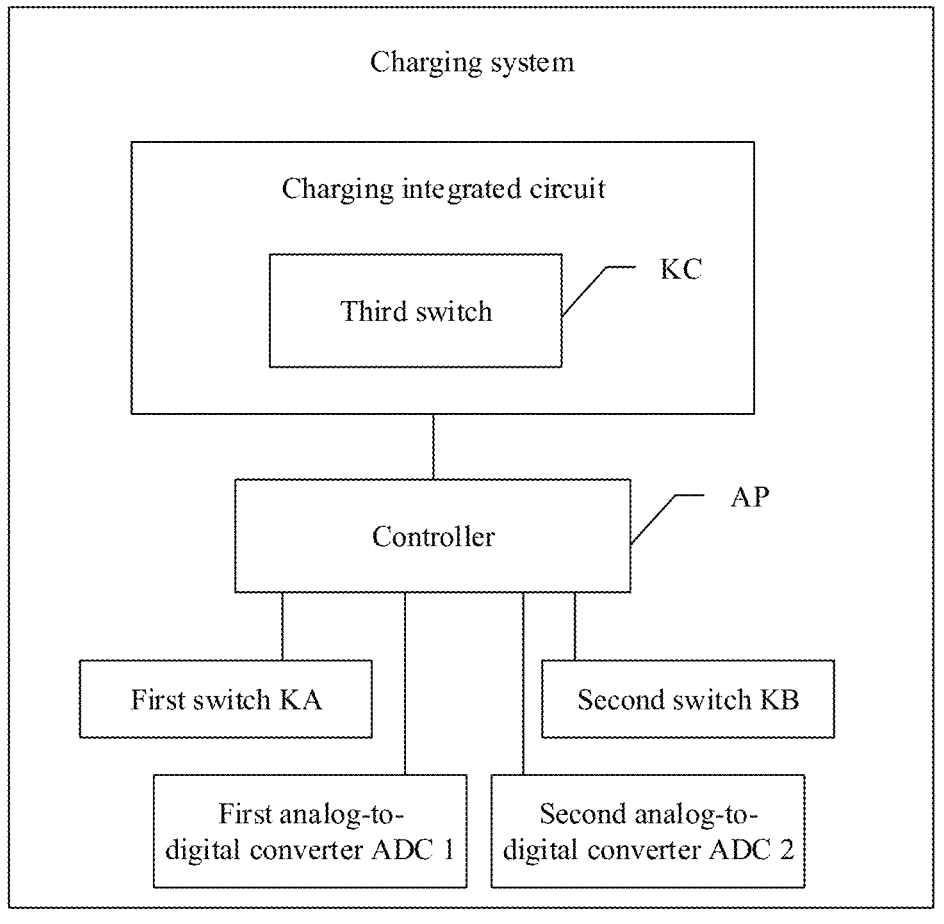
FIG. 8 is a schematic diagram of a structure of yet still another charging system according to an embodiment of this application.

FIG. 8 is a schematic diagram of a structure of yet still another charging system according to an embodiment of this application.

As shown in FIG. 8, the charging system further includes a first analog-to-digital converter ADC 1 and a second analog-to-digital converter ADC 2.

The first analog-to-digital converter ADC 1 is configured to collect a voltage of a first battery, convert the voltage of the first battery into a first digital signal, and send the first digital signal to a controller AP.

The second analog-to-digital converter ADC 2 is configured to collect a voltage of a second battery, convert the voltage of the second battery into a second digital signal, and send the second digital signal to the controller AP.

The first analog-to-digital converter ADC 1 or the second analog-to-digital converter ADC 2 may be further configured to collect a charging current of a charging path in which the first battery and the second battery are located. In addition, the system may further include a coulometer, configured to collect the charging current.

The controller AP is further configured to: when determining that the charging current is less than a second preset current, control a charging integrated circuit 501 to stop charging the first battery and the second battery.

In actual application, if the voltages of the two batteries exceed a preset rated voltage for some reason, a suppression measure needs to be immediately taken to avoid further impact of overcharging.

In the charging system provided in this embodiment, the controller AP is further configured to: when determining that the target voltage is greater than twice the preset rated voltage, use twice the preset rated voltage as the target voltage.

The controller AP sets the target voltage in the foregoing manner and sends the target voltage to the charging integrated circuit 501, so that the charging integrated circuit 501 can use the target voltage (that is, twice the preset rated voltage) of this preset period as a switching point for controlling charging mode switching, to prevent battery overcharging caused by untimely switching to the constant voltage mode.

Based on the electronic device and the charging system provided in the foregoing embodiments, correspondingly, this application further provides a charging method. The following describes the charging method with reference to the embodiments and accompanying drawings.

Figure 9:
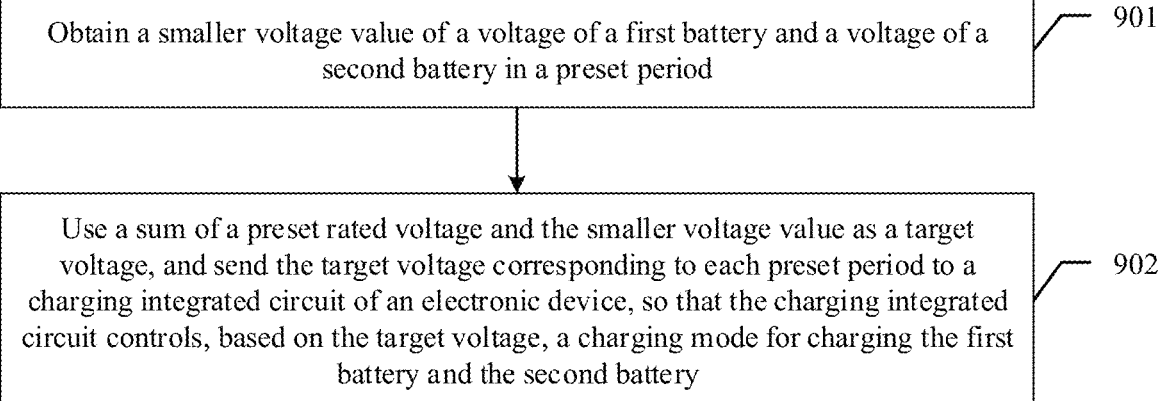
FIG. 9 is a flowchart of a charging method according to an embodiment of this application.

FIG. 9 is a flowchart of a charging method according to an embodiment of this application. The method is used to charge a plurality of batteries connected in series on the electronic device provided in the foregoing embodiment.

As shown in FIG. 9, the charging method includes the following steps.

Step 901: Obtain a smaller voltage value of a voltage of a first battery and a voltage of a second battery in a preset period.

The first battery and the second battery are two batteries connected in series on the electronic device.

Step 902: Use a sum of a preset rated voltage and the smaller voltage value as a target voltage, and send a target voltage corresponding to each preset period to a charging integrated circuit of the electronic device, so that the charging integrated circuit controls, based on the target voltage, a charging mode for charging the first battery and the second battery.

The preset rated voltage is a respective rated voltage respectively of the first battery and the second battery.

The charging integrated circuit has a function of controlling a constant current or a constant voltage in charging a battery. Because the charging integrated circuit controls the charging mode based on the corresponding target voltage in each preset period, and the target voltage is set based on the actual minimum voltage value of the two batteries in the preset period, after the target voltage is sent to the charging integrated circuit, the charging integrated circuit can dynamically and flexibly control the charging mode in real time based on the target voltage in different preset periods, to prevent battery overcharging caused by inappropriate control of the charging mode. It can be learned that the charging method provided in this embodiment of this application can effectively avoid battery overcharging, improve reliability of charging the batteries, reduce a charging safety hazard, and reduce the adverse impact of overcharging on battery lifespan.

In addition, according to the charging method, battery overcharging is not prevented by bypass diversion or repeated charging and discharging. Therefore, a heating problem and a charging safety problem caused by an excessively large bypass current can be avoided, and a charging speed of the battery is not affected. In this way, the user experience is improved.

The target voltage of each preset period is set by the controller based on the minimum voltage value of the two batteries and the preset rated voltage, and the target voltage of each preset period after charging is used as an important basis for controlling charging mode switching by the charging integrated circuit. The variable minimum voltage, instead of a fixed voltage value or rated voltage of a battery, is used as the basis for setting the target voltage, so that the target voltage has a good fault tolerance capability. For example, in actual application, high-low conversion may happen to the voltages of two batteries. In this case, battery overcharging that may happen after high-low conversion happens to the voltages of the two batteries can be well suppressed by using the target voltage to control charging mode switching.

In actual application, if the voltages of the two batteries exceed a preset rated voltage for some reason, a suppression measure needs to be immediately taken to avoid further impact of overcharging.

FIG. 10 is a flowchart of another charging method according to an embodiment.

As shown in FIG. 10, the charging method includes the following steps.

Step 1001 is the same as step 901 in the foregoing embodiment. Details are not described herein again.

Step 1002: Use a sum of a preset rated voltage and a smaller voltage value as a target voltage.

Step 1003: Determine whether the target voltage is greater than twice the preset rated voltage. If the target voltage is greater than twice the preset rated voltage, step 1004 is performed. If the target voltage is not greater than twice the preset rated voltage, step 1005 is performed.

Step 1004: When the target voltage is greater than twice the preset rated voltage, use twice the preset rated voltage as the target voltage. Then step 1005 is performed.

Step 1005: Send the target voltage to the charging integrated circuit, so that the charging integrated circuit controls, based on the target voltage, a charging mode for charging a first battery and a second battery.

In the method, the target voltage is reset and the reset target voltage is sent to the charging integrated circuit, so that the charging integrated circuit can use, in the preset period, twice the preset rated voltage as a switching point for controlling charging mode switching, to prevent battery overcharging caused by untimely switching to the constant voltage mode.

An impedance exists between a voltage sampling point of a battery and an electrochemical cell of the battery, and an impedance exists in a connection line between respective electrochemical cells of the batteries connected in series. As a result, when a charging current is larger, a terminal voltage floats more dramatically after the batteries are connected in series. Therefore, the charging integrated circuit timely controls the charging mode to switch to the constant voltage mode. This slows down the charging speed.

Based on this, the charging system provided in this embodiment may further correct the target voltage to resolve a problem that the charging speed is affected by terminal voltage floating after the batteries are connected in series.

FIG. 11 is a flowchart of still another charging method according to an embodiment.

As shown in FIG. 11, the charging method includes the following steps.

Step 1101 is the same as step 901 in the foregoing embodiment. Details are not described herein again.

Step 1102: Use a sum of a preset rated voltage and a smaller voltage value as a target voltage.

Step 1103: Use, in a preset period, a sum of the target voltage and a correction voltage as a corrected target voltage.

The correction voltage is a product of a charging line impedance and a charging current collected in the preset period, and the charging line impedance includes an impedance between a sampling point of a terminal and an electrochemical cell of the first battery and an impedance between the electrochemical cell of the first battery and an electrochemical cell of the second battery.

Step 1104: Send the corrected target voltage to a charging integrated circuit, so that the charging integrated circuit controls, based on the corrected target voltage, a charging mode for charging the first battery and the second battery.

The corrected target voltage increases relative to the uncorrected target voltage, so as to implement compensation for the target voltage. For the charging integrated circuit, it is clear that a speed at which the terminal voltage generated after the batteries are connected in series reaches the corrected target voltage is slowed down, that is, a time point at which the charging mode is switched is correspondingly delayed. In this way, the charging integrated circuit may have more time to charge the battery at a constant current before the constant voltage charging. This improves the charging speed of the battery, so that the battery can be fully charged more quickly, and the user experience is improved.

In actual application, it is usually difficult for the charging integrated circuit to control a synchronization rate of charging a plurality of batteries connected in series, and it is likely that one of the batteries connected in series is fully charged first. In this case, to enable the plurality of batteries connected in series to be fully charged synchronously as much as possible, and shorten overall battery charging duration, this application further provides the following implementations for balanced charging of the battery.

For the electronic device shown in FIG. 4a, based on the charging method provided in the foregoing embodiment, the charging method provided in this embodiment further includes:

when a larger voltage value of a voltage of the first battery and a voltage of the second battery is greater than a first preset voltage, and a voltage difference between the first battery and the second battery is greater than a second preset voltage, controlling a switch connected in parallel to a battery corresponding to the larger voltage value to be repeatedly closed and opened, and collecting the voltage of the first battery and the voltage of the second battery each time the switch is opened, until the voltage difference between the first battery and the second battery is less than a third preset voltage.

The first preset voltage is less than a preset rated voltage, the first preset voltage is greater than the second preset voltage, and the second preset voltage is greater than the third preset voltage.

In a balance process, each time the switch connected in parallel to the battery corresponding to the larger voltage value is opened and after the voltages of two batteries are collected, the voltage difference may be compared with the third preset voltage. If the voltage difference |Va−Vb| is less than the third preset voltage, it indicates that the voltage difference between the two batteries is small enough, and in this case, balanced charging may be stopped. However, if the voltage difference is greater than or equal to the third preset voltage, it indicates that the voltage difference between the two batteries is still not small enough, and there is still a large difference between the power levels of the two batteries. In this case, the foregoing repeated closing and opening operations of the switch (the first switch KA or the second switch KB) connected in parallel to the battery corresponding to the larger voltage value Vmax further need to be repeated, so as to continuously perform balanced charging on the battery.

When the voltages of the two batteries are collected, the charging IC continues to charge the two batteries. As a result, charging currents still flow through the two batteries. This may still affect accuracy of battery voltage collection. To resolve this problem, for the electronic device shown in FIG. 4a, the charging method provided in this embodiment may further include:

when determining that the voltage difference between the first battery and the second battery is greater than the second preset voltage and the charging current is less than the first preset current, sending a disconnection control signal to the charging integrated circuit, so that the charging integrated circuit controls the third switch to be opened; and sending a connection control signal to the charging integrated circuit when the switch connected in parallel to the battery corresponding to the larger voltage value is closed, so that the charging integrated circuit controls the third switch to be closed.

When the charging current is less than the first preset current, it indicates that the battery with a relatively high voltage is about to be fully charged. However, because the voltage difference is still greater than the second preset voltage, balanced charging further needs to be performed. In this stage of the balance process, the repeated closing and opening operations of the switch (the first switch or the second switch) connected in parallel with the battery corresponding to the larger voltage value are controlled repeatedly. The controller sends a signal to the charging integrated circuit while controlling the switch to be closed and opened, so that the third switch in the charging integrated circuit is repeatedly closed and opened.

When the third switch is opened, no charging current flows through the two batteries. In this case, the two batteries are neither charged nor discharged, accuracy of collected voltages respectively of the two batteries is improved. Both balanced charging control and charging mode (constant current or constant voltage) control depend on the voltages of the batteries, so that accuracy of both balanced charging control and charging mode control is improved. Therefore, the charging method provided in this embodiment has a relatively good effect of preventing battery overcharging and a relatively good effect of balanced charging, and the battery and the entire electronic device are safer in use.

Optionally, the charging method provided in this embodiment further includes:

when determining that the charging current is less than a second preset current, controlling the charging integrated circuit to stop charging the first battery and the second battery.

Figure 12A:
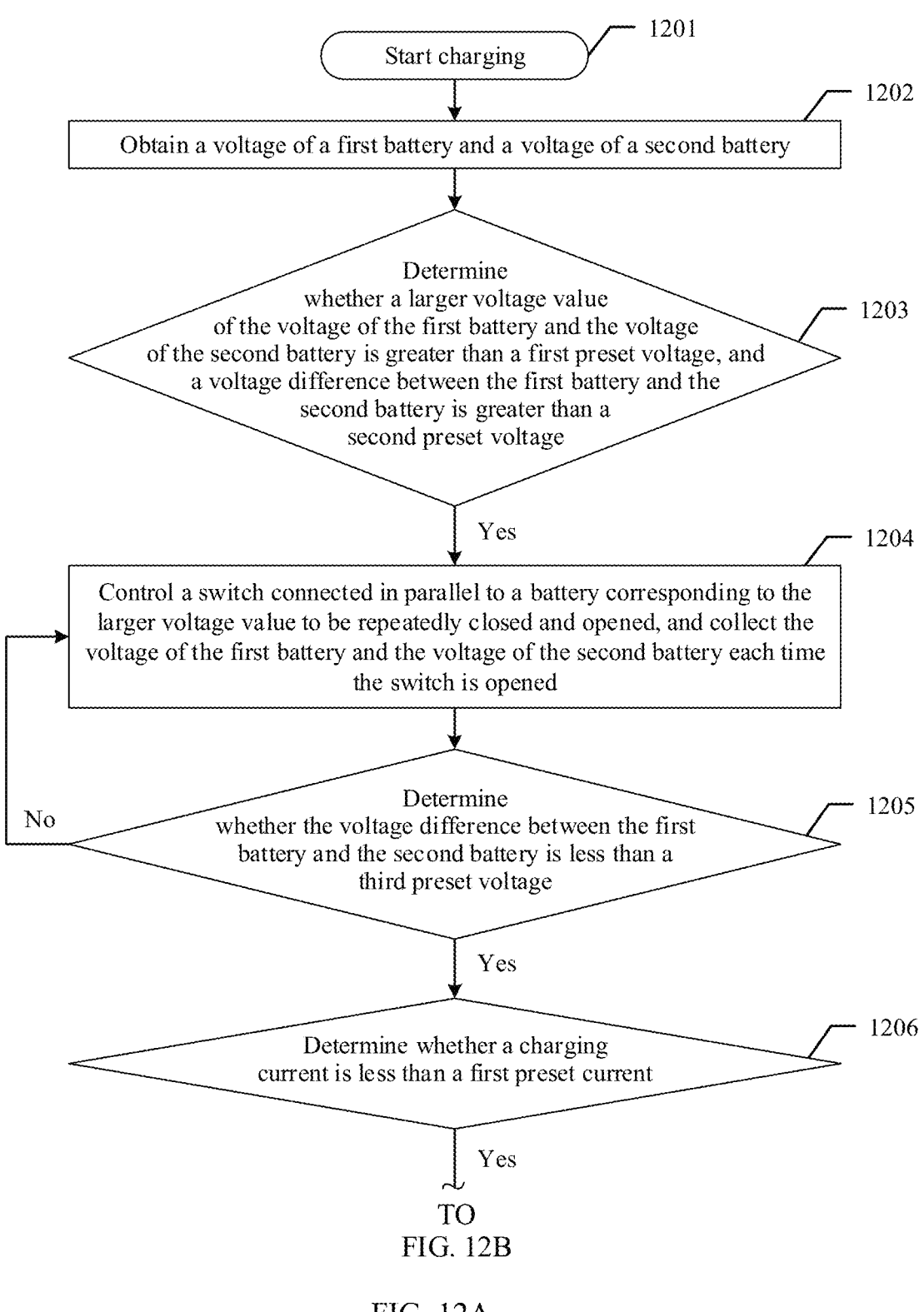
FIG. 12A and FIG. 12B are a flowchart of yet still another charging method according to an embodiment of this application.
Figure 12B:
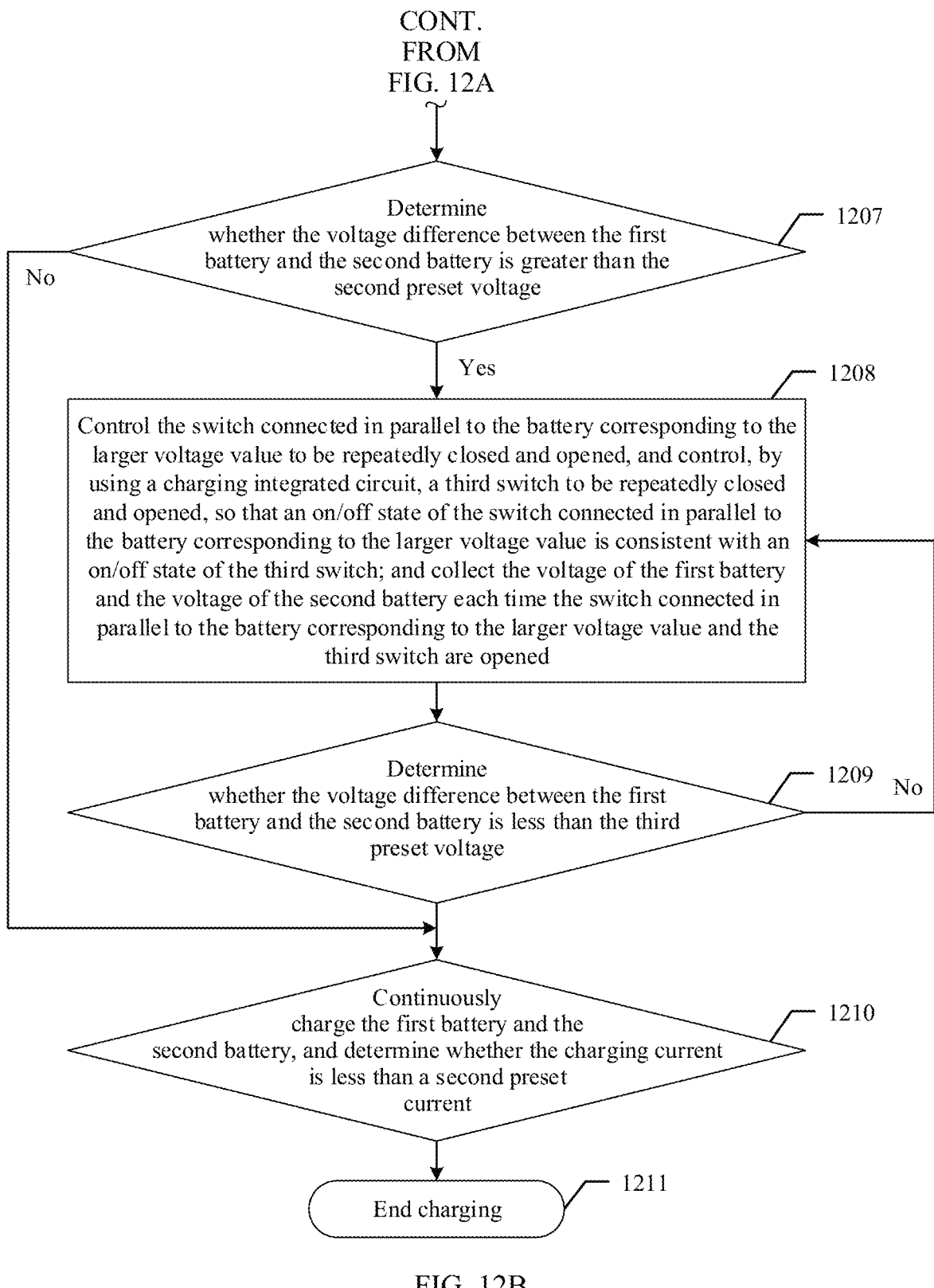

To facilitate understanding of a process of balanced charging of a plurality of batteries, specific implementation of yet another charging method is described in this embodiment with reference to FIG. 12A and FIG. 12B. The method is applied in charging a first battery and a second battery that are connected in series on an electronic device.

FIG. 12A and FIG. 12B are a flowchart of yet still another charging method according to an embodiment of this application.

As shown in FIG. 12, the yet still another charging method provided in this embodiment includes the following steps.

Step 1201: Start charging a first battery and a second battery.

Step 1202: Obtain a voltage of the first battery and a voltage of the second battery.

Step 1203: Determine whether a larger voltage value of the voltage of the first battery and the voltage of the second battery is greater than a first preset voltage, and a voltage difference between the first battery and the second battery is greater than a second preset voltage. If the larger voltage value of the voltage of the first battery and the voltage of the second battery is greater than the first preset voltage, and the voltage difference between the first battery and the second battery is greater than the second preset voltage, a first charging stage begins.

The first charging stage is mainly described with reference to steps 1204 to 1206.

Step 1204: Control a switch connected in parallel to a battery corresponding to the larger voltage value to be repeatedly closed and opened, and collect the voltage of the first battery and the voltage of the second battery each time the switch is opened.

Step 1205: Determine whether the voltage difference between the first battery and the second battery is less than a third preset voltage. If the voltage difference between the first battery and the second battery is less than the third preset voltage, step 1206 is performed. If the voltage difference between the first battery and the second battery is not less than the third preset voltage, step 1204 is performed.

Step 1206: Determine whether a charging current is less than a first preset current. If the charging current is less than the first preset current, balance in the first charging stage is ended, and step 1207 is performed.

Step 1207: Determine whether the voltage difference between the first battery and the second battery is greater than the second preset voltage. If the voltage difference between the first battery and the second battery is greater than the second preset voltage, a second charging stage begins. If the voltage difference between the first battery and the second battery is not greater than the second preset voltage, a third charging stage begins.

The second charging stage is mainly described with reference to steps 1208 and 1209. In the second charging stage, a low-voltage battery is recharged to increase the voltage of the battery, so that the voltage of the battery gradually approaches the voltage of the other battery. In the second charging stage, a third switch is controlled to be synchronously closed and opened with the switch connected in parallel to the battery corresponding to the larger voltage value, so as to improve voltage collection accuracy.

Step 1208: Control the switch connected in parallel to the battery corresponding to the larger voltage value to be repeatedly closed and opened, and control, by using the charging integrated circuit, the third switch to be repeatedly closed and opened, where an on/off state of the switch connected in parallel to the battery corresponding to the larger voltage value is consistent with an on/off state of the third switch; and collect the voltage of the first battery and the voltage of the second battery each time the switch connected in parallel to the battery corresponding to the larger voltage value and the third switch are opened.

Step 1209: Determine whether the voltage difference between the first battery and the second battery is less than the third preset voltage. If the voltage difference between the first battery and the second battery is less than the third preset voltage, balance in the second charging stage is ended, and the third charging stage begins. If the voltage difference between the first battery and the second battery is not less than the third preset voltage, step 1208 is performed.

The third charging stage is mainly described with reference to steps 1210 and 1211.

Step 1210: Continuously charge the first battery and the second battery, determine whether the charging current is less than a second preset current. If the charging current is less than the second preset current, step 1211 is performed.

Step 1211: Control the charging integrated circuit to stop charging the first battery and the second battery, and the charging ends.

It should be noted that, in the charging method provided in this embodiment, in the first charging stage, the second charging stage, and the third charging stage, smaller voltage values of the voltages of the first battery and the voltages of the second battery are respectively periodically obtained. A sum of a preset rated voltage and the smaller voltage value is used as a target voltage of a current period of a current charging stage, and the target voltage is sent to the charging integrated circuit of the electronic device, so that the charging integrated circuit controls, based on the target voltage, a charging mode for charging the first battery and the second battery.

As mentioned above, in a charge balance process, the voltages of two batteries connected in series are collected on the premise that the switch connected in parallel to the battery corresponding to the larger voltage value is opened. Because when the switch is opened, the charging integrated circuit also controls the third switch to be opened, so that no charging current flows through the two batteries. In this way, the collected voltages of the two batteries are more accurate. It may be understood that because accuracy of the obtained voltages is improved, and both balanced charging control and charging mode (constant current or constant voltage) control depend on the voltages of the batteries, accuracy of both the balanced charging control and the charging mode control is improved. Therefore, the charging system provided in this embodiment has a relatively good effect of preventing battery overcharging and a relatively good effect of balanced charging, and the battery and the charging system are safer in use.

It should be understood that, in this application, "at least one" means one or more, and "a plurality of" means two or more. The term "and/or" is used to describe an association relationship between associated objects, and represents that three relationships may exist. For example, "A and/or B" may represent the following three cases: Only A exists, only B exists, and both A and B exist, where A and B may be singular or plural. The character "/" usually indicates an "or" relationship between the associated objects. "At least one of the following items (pieces)" or a similar expression thereof indicates any combination of these items, including a single item (piece) or any combination of a plurality of items (pieces). For example, at least one (piece) of a, b, or c may represent: a, b, c, "a and b", "a and c", "b and c", or "a, b, and c", where a, b, and c may be singular or plural.

The foregoing descriptions are merely preferable embodiments of this application, but are not intended to limit this application. Although the preferable embodiments of this application are disclosed above, the embodiments are not intended to limit this application. By using the method and the technical content disclosed above, any person of ordinary skill in the art can make a plurality of possible changes and modifications on the technical solutions of this application, or amend the technical solutions thereof to be embodiments with equal effects through equivalent variations without departing from the protection scope of the technical solutions of this application. Therefore, any simple amendment, equivalent variation, and modification made on the embodiments above according to the technical essence of this application without departing from the content of the technical solutions of this application shall fall within the protection scope of the technical solutions of this application.

What is claimed is:

1. An electronic device, comprising:

a first battery, a second battery, a charging integrated circuit, and a controller, wherein an input end of the charging integrated circuit is configured to be connected to a power adapter, an output end of the charging integrated circuit is connected to a positive electrode of the first battery, a negative electrode of the first battery is connected to a positive electrode of the second battery such that the first and second batteries are connected in series, and a negative electrode of the second battery is grounded;

the controller is configured to obtain a smaller voltage value as between a voltage of the first battery and a voltage of the second battery in a preset period, use a sum of a preset rated voltage and the smaller voltage value as a target voltage, and send the target voltage to the charging integrated circuit, so that the charging integrated circuit controls, based on the target voltage, a charging mode for charging the first battery and the second battery; and a first switch and a second switch, wherein the first switch and a resistor are connected in series and connected in parallel to two ends of the first battery, and the second switch and the resistor are connected in series and connected in parallel to two ends of the second battery; and the controller is further configured to: when a larger voltage value as between the voltage of the first battery and the voltage of the second battery is greater than a first preset voltage, and a voltage difference between the voltage of the first battery and the voltage of the second battery is greater than a second preset voltage, control a switch connected in parallel to whichever of the first and second batteries having the larger voltage value to be repeatedly closed and opened, and measure the voltage of the first battery and the voltage of the second battery each time the switch is opened, until the voltage difference is less than a third preset voltage; wherein the first preset voltage is less than the preset rated voltage, the first preset voltage is greater than the second preset voltage, and the second preset voltage is greater than the third preset voltage.

2. The electronic device according to claim 1, wherein the charging integrated circuit is configured to switch the charging mode from a constant current charging mode to a constant voltage charging mode when a terminal voltage reaches the target voltage.

3. The electronic device according to claim 1, wherein the controller is further configured to: determine a corrected target voltage as a sum of the target voltage and a correction voltage, and send the corrected target voltage to the charging integrated circuit in the preset period, wherein the correction voltage is a product of a charging line impedance and a charging current measured in the preset period, and the charging line impedance comprises an impedance between a sampling point of a terminal and an electrochemical cell of the first battery and an impedance between the electrochemical cell of the first battery and an electrochemical cell of the second battery.

4. The electronic device according to claim 1, wherein the charging integrated circuit comprises a third switch, wherein the third switch is connected in series to a charging path of the first battery and the second battery; and the controller is further configured to send a disconnection control signal to the charging integrated circuit when the voltage difference is greater than the second preset voltage and a charging current is less than a first preset current, so that the charging integrated circuit controls the third switch to be opened; and the controller is further still configured to send a connection control signal to the charging integrated circuit when the switch connected in parallel to the battery having the larger voltage value is closed, so that the charging integrated circuit controls the third switch to be closed, wherein an on/off state of the third switch is consistent with an on/off state of the switch connected in parallel to the battery having the larger voltage value.

5. The electronic device according to claim 1, wherein the controller is further configured to: when the charging current is less than a second preset current, control the charging integrated circuit to stop charging the first battery and the second battery.

6. The electronic device according to claim 1, wherein the controller is further configured to: when the target voltage is greater than twice the preset rated voltage, use twice the preset rated voltage as the target voltage.

7. The electronic device according to claim 1, further comprising a first analog-to-digital converter and a second analog-to-digital converter, wherein the first analog-to-digital converter is configured to measure the voltage of the first battery, convert the voltage of the first battery into a first digital signal, and send the first digital signal to the controller; and the second analog-to-digital converter is configured to measure the voltage of the second battery, convert the voltage of the second battery into a second digital signal, and send the second digital signal to the controller.

8. A charging method, comprising:

obtaining a smaller voltage value as between a voltage of a first battery and a voltage of a second battery in a preset period, wherein a negative electrode of the first battery is connected to a positive electrode of the second battery such that the first battery and the second battery are connected in series;

using a sum of a preset rated voltage and the smaller voltage value as a target voltage, and sending the target voltage corresponding to the preset period to a charging integrated circuit, so that the charging integrated circuit controls, based on the target voltage, a charging mode for charging the first battery and the second battery; and when a larger voltage value as between the voltage of the first battery and the voltage of the second battery is greater than a first preset voltage, and a voltage difference between the first battery and the second battery is greater than a second preset voltage, controlling a switch connected in parallel to whichever of the first and second batteries having the larger voltage value to be repeatedly closed and opened, and measuring the voltage of the first battery and the voltage of the second battery each time the switch is opened, until the voltage difference between the first battery and the second battery is less than a third preset voltage; wherein the first preset voltage is less than the preset rated voltage, the first preset voltage is greater than the second preset voltage, and the second preset voltage is greater than the third preset voltage.

9. The method according to claim 8, wherein before sending the target voltage to the charging integrated circuit, the method further comprises:

using, in the preset period, a sum of the target voltage and a correction voltage as a corrected target voltage, wherein the correction voltage is a product of a charging line impedance and a charging current measured in the preset period, and the charging line impedance comprises an impedance between a sampling point of a terminal and an electrochemical cell of the first battery and an impedance between the electrochemical cell of the first battery and an electrochemical cell of the second battery.

10. The method according to claim 8, wherein the charging integrated circuit comprises a third switch, wherein the third switch is connected in series to a charging path of the first battery and the second battery; and the method further comprises:

sending a disconnection control signal to the charging integrated circuit when the voltage difference is greater than the second preset voltage and a charging current is less than a first preset current, so that the charging integrated circuit controls the third switch to be opened, and sending a connection control signal to the charging integrated circuit when the switch connected in parallel to the battery having the larger voltage value is closed, so that the charging integrated circuit controls the third switch to be closed, wherein an on/off state of the third switch is consistent with an on/off state of the switch connected in parallel to the battery having the larger voltage value.

11. The method according to claim 10, further comprising: when the charging current is less than a second preset current, controlling the charging integrated circuit to stop charging the first battery and the second battery.

12. A charging system, comprising:

a charging integrated circuit, a first battery, a second battery, and a controller, wherein an input end of the charging integrated circuit is connected to a power adapter, an output end of the charging integrated circuit is configured to be connected to a positive electrode of the first battery, a negative electrode of the first battery is connected to a positive electrode of the second battery such that the first and second batteries are connected in series, and a negative electrode of the second battery is grounded;

the controller is configured to obtain a smaller voltage value as between a voltage of the first battery and a voltage of the second battery in a preset period, use a sum of a preset rated voltage and the smaller voltage value as a target voltage, and send the target voltage to the charging integrated circuit, so that the charging integrated circuit controls, based on the target voltage, a charging mode for charging the first battery and the second battery; and a first switch and a second switch, wherein the first switch and a resistor are connected in series and connected in parallel to two ends of the first battery, and the second switch and the resistor are connected in series and connected in parallel to two ends of the second battery; and the controller is further configured to: when a larger voltage value as between the voltage of the first battery and the voltage of the second battery is greater than a first preset voltage, and a voltage difference between the voltage of the first battery and the voltage of the second battery is greater than a second preset voltage, control a switch connected in parallel to whichever of the first and second batteries having the larger voltage value to be repeatedly closed and opened, and measure the voltage of the first battery and the voltage of the second battery each time the switch is opened, until the voltage difference is less than a third preset voltage; wherein the first preset voltage is less than the preset rated voltage, the first preset voltage is greater than the second preset voltage, and the second preset voltage is greater than the third preset voltage.

13. The system according to claim 12, wherein the controller is further configured to: use a sum of the target voltage and a correction voltage as a corrected target voltage, and send the corrected target voltage to the charging integrated circuit in the preset period, wherein the correction voltage is a product of a charging line impedance and a charging current measured in the preset period, and the charging line impedance comprises an impedance between a sampling point of a terminal and an electrochemical cell of the first battery and an impedance between the electrochemical cell of the first battery and an electrochemical cell of the second battery.

14. The system according to claim 12, wherein the charging integrated circuit comprises a third switch, wherein the third switch is connected in series to a charging path of the first battery and the second battery; and the controller is further configured to send a disconnection control signal to the charging integrated circuit when the voltage difference is greater than the second preset voltage and a charging current is less than a first preset current, so that the charging integrated circuit controls the third switch to be opened, and further configured to send a connection control signal to the charging integrated circuit when the switch connected in parallel to the battery having the larger voltage value is closed, so that the charging integrated circuit controls the third switch to be closed, wherein an on/off state of the third switch is consistent with an on/off state of the switch connected in parallel to the battery having the larger voltage value.

15. The system according to claim 12, wherein the controller is further configured to: when the target voltage is greater than twice the preset rated voltage, use twice the preset rated voltage as the target voltage.

16. The system according to claim 12, further comprising a first analog-to-digital converter and a second analog-to-digital converter, wherein the first analog-to-digital converter is configured to measure the voltage of the first battery, convert the voltage of the first battery into a first digital signal, and send the first digital signal to the controller; and the second analog-to-digital converter is configured to measure the voltage of the second battery, convert the voltage of the second battery into a second digital signal, and send the second digital signal to the controller.

17. The system according to claim 12, wherein the charging integrated circuit is further configured to switch the charging mode from constant current charging to constant voltage charging when a terminal voltage reaches the target voltage.

* * * * *